United States Patent [19]
Nagano et al.

[11] Patent Number: 5,963,107
[45] Date of Patent: Oct. 5, 1999

[54] PULSE-WIDTH MODULATION SIGNAL GENERATOR

[75] Inventors: Hideo Nagano; Yasuhiro Kan, both of Tokyo, Japan

[73] Assignee: Mitsubishi Denki Kabushiki Kaisha, Tokyo, Japan

[21] Appl. No.: 09/056,626

[22] Filed: Apr. 8, 1998

[30] Foreign Application Priority Data

Nov. 14, 1997 [JP] Japan .................................. 9-314102

[51] Int. Cl.⁶ .......................... H03K 7/08; H03L 7/099
[52] U.S. Cl. ...................... 332/109; 331/1 A; 331/17; 331/45; 331/49; 327/172; 327/176; 315/246; 315/291; 360/29; 375/238
[58] Field of Search .................... 332/109–111; 331/1 A, 331/2, 17, 25, 45, 49, 57, 74, 179; 375/238; 360/29; 315/246, 291; 327/172–176

[56] References Cited

U.S. PATENT DOCUMENTS 5,268,656 12/1993 Muscavage ................................ 331/45
5,475,344 12/1995 Maneatis et al. .......................... 331/57

FOREIGN PATENT DOCUMENTS

| 63-200221 | 8/1988 | Japan . |
| 5191234 | 7/1993 | Japan . |
| 6326574 | 11/1994 | Japan . |
| 7106956 | 4/1995 | Japan . |
| 851346 | 2/1996 | Japan . |
| 8102660 | 4/1996 | Japan . |

*Primary Examiner*—David Mis
*Attorney, Agent, or Firm*—Leydig, Voit & Mayer, Ltd.

[57] ABSTRACT

A pulse-width modulation signal generator having a pre-phase converter which includes N pre-delay circuits connected in cascade, and N main phase converters each of which includes M main delay circuits, where N and M are natural numbers greater than one, and N>M. The output of each of the N pre-phase circuits is supplied to one of the N main phase converters to generate phase converted clock signals used for generating a pulse-width modulation signal.

14 Claims, 16 Drawing Sheets

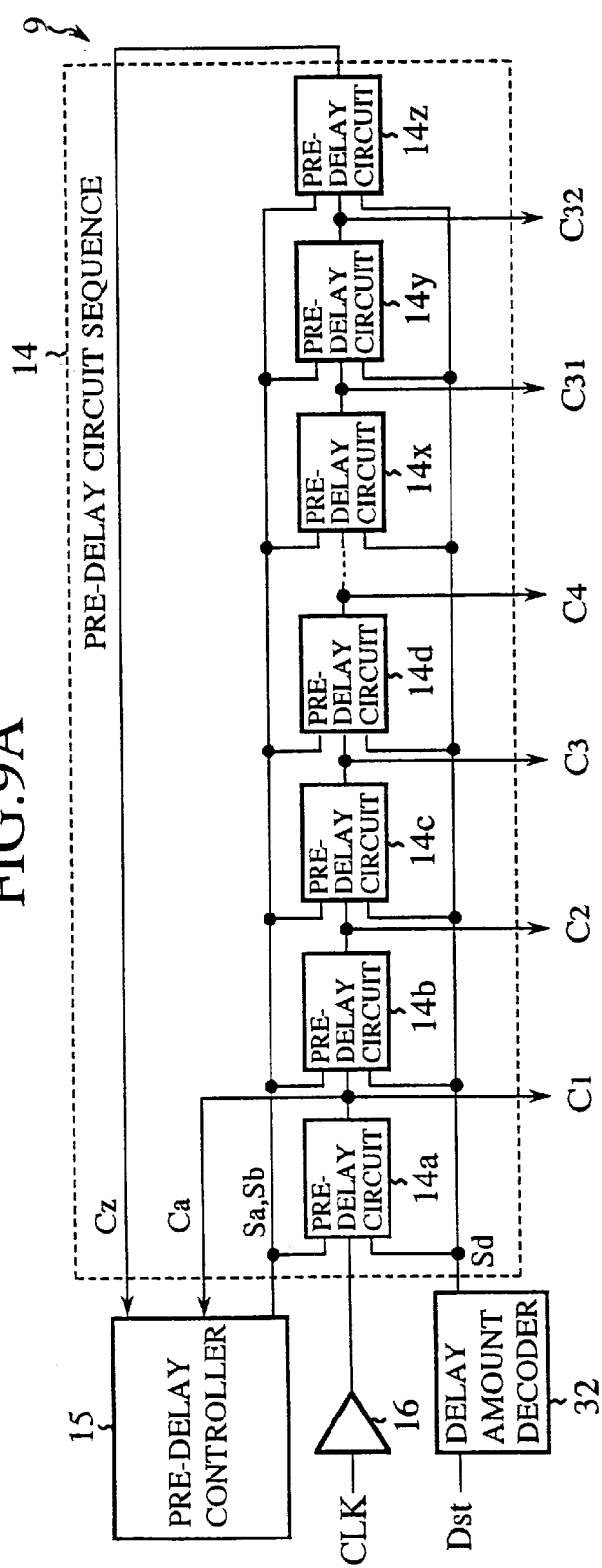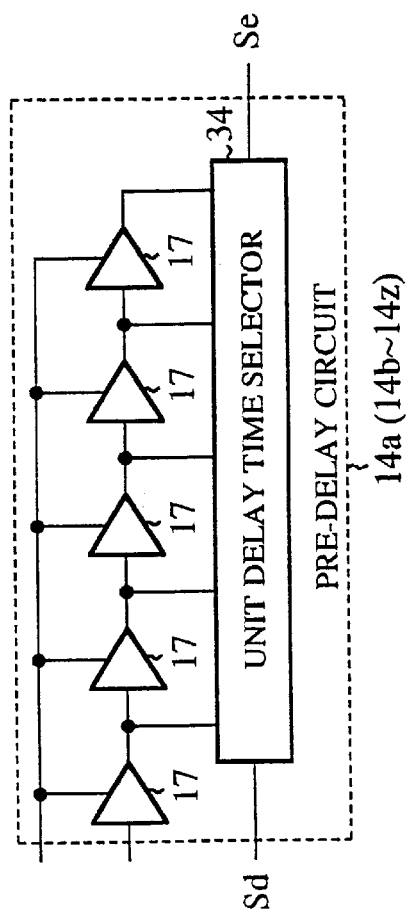

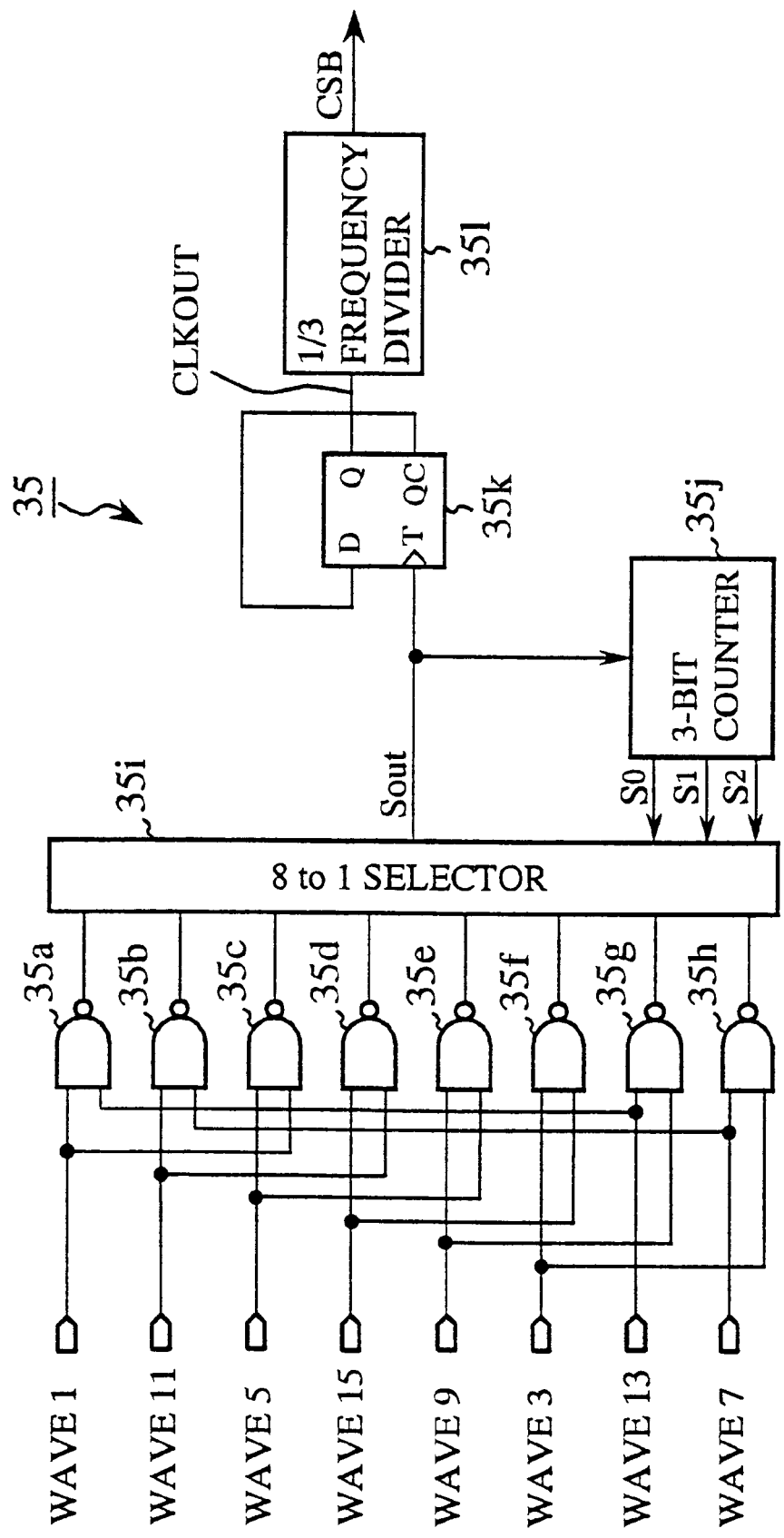

FIG.12
| S2 | S1 | S0 | Sout |
|----|----|----|------|
| L | L | L | wave 1&13 |
| L | L | H | wave 11&7 |
| L | H | L | wave 5&1 |
| L | H | H | wave 15&11 |
| H | L | L | wave 9&5 |
| H | L | H | wave 3&15 |
| H | H | L | wave 13&9 |
| H | H | H | wave 7&3 |
FIG.15A
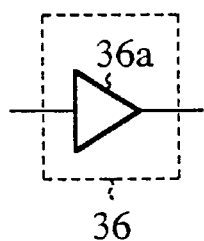
FIG.15B
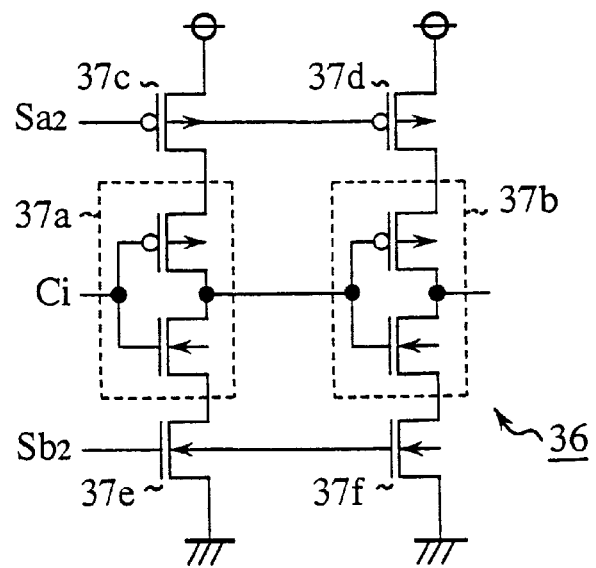

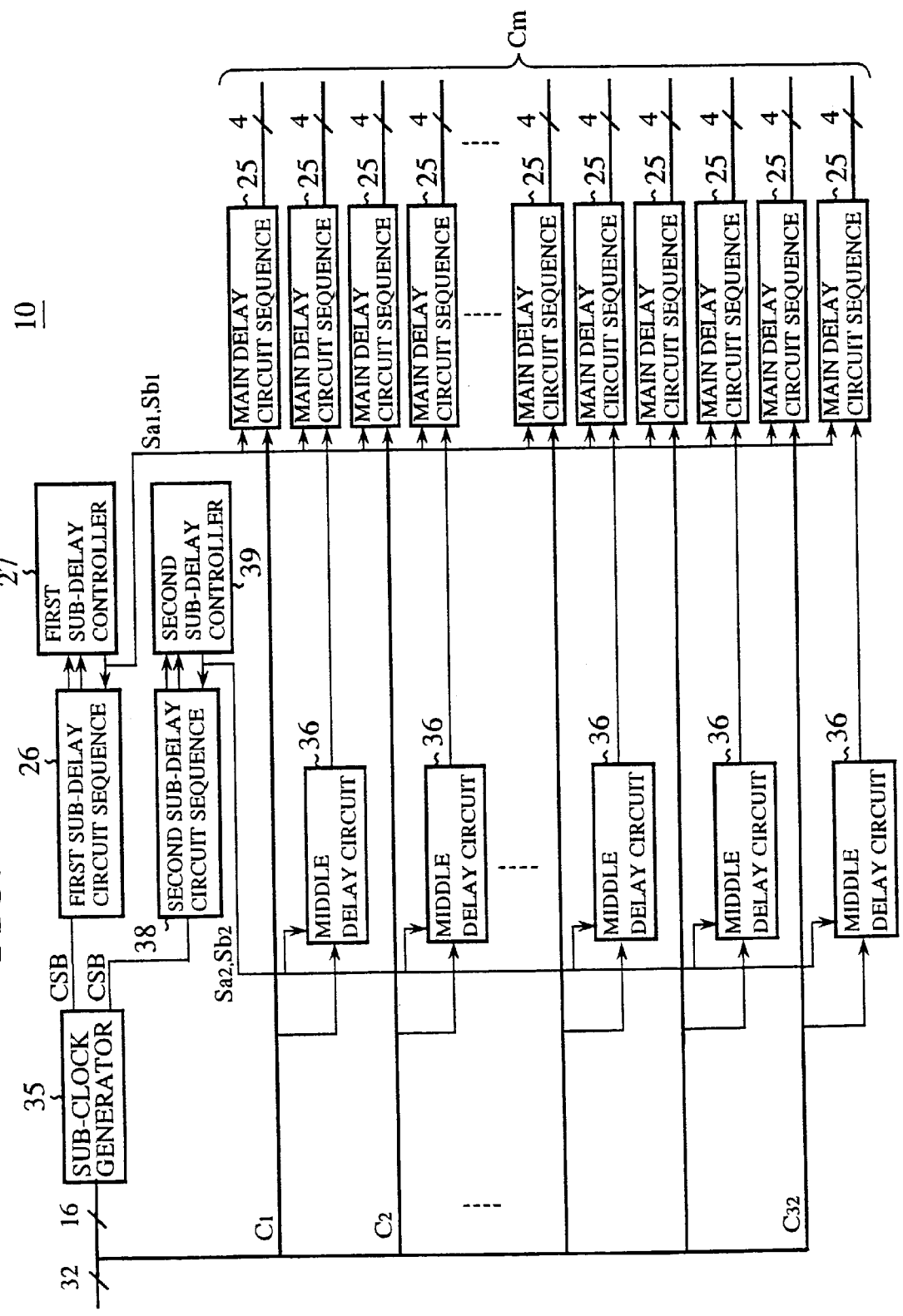

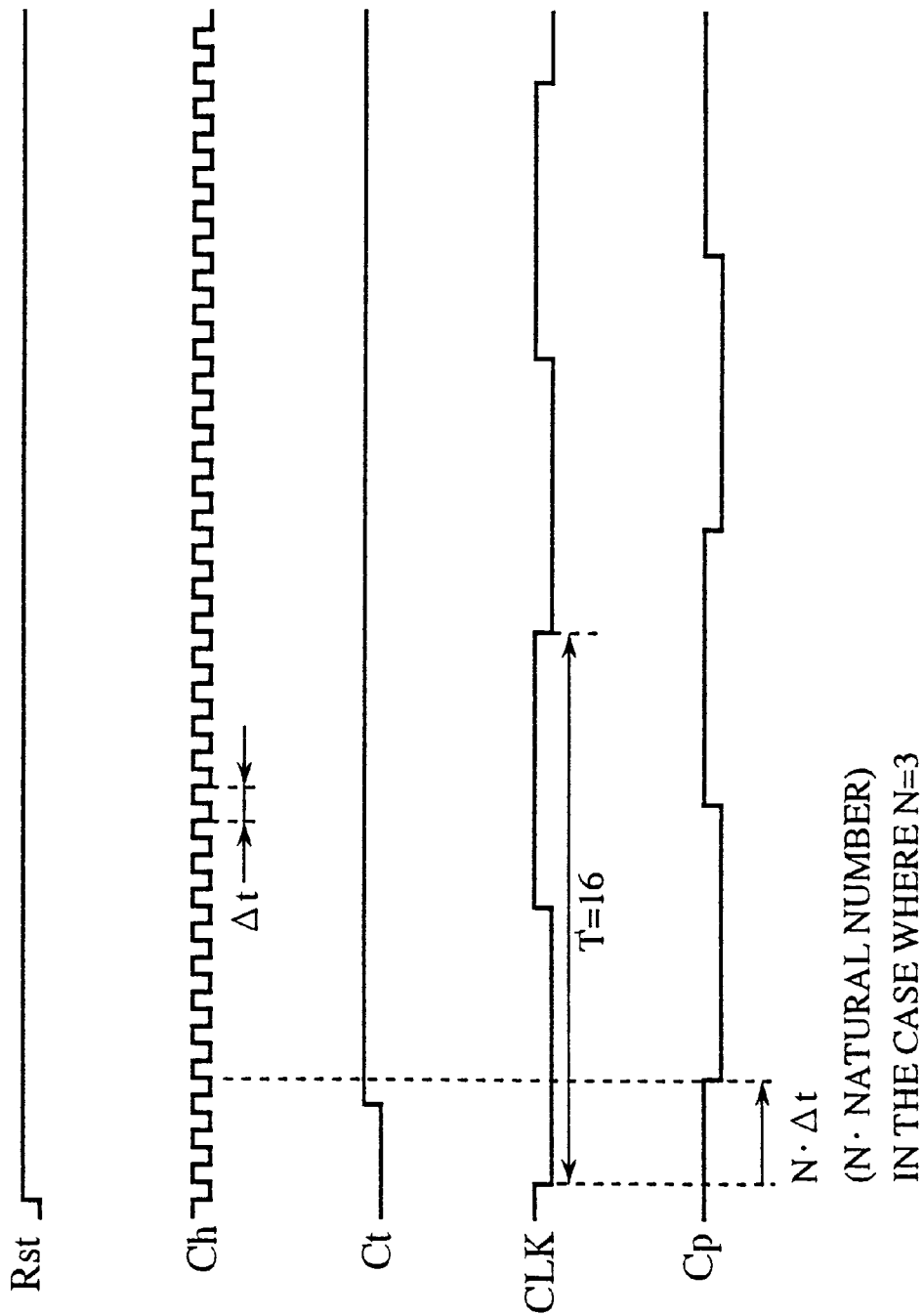

PULSE-WIDTH MODULATION SIGNAL GENERATOR

BACKGROUND OF THE INVENTION

1. Field of the Invention

The present invention relates to a pulse-width modulation signal generator preferably used for controlling a light emitting device such as a laser diode in an electrophotographic image forming apparatus like a laser printer.

2. Description of Related Art

FIG. 16 is a block diagram showing a configuration of an image output portion of a conventional laser printer. In FIG. 16, the reference numeral 60 designates a pixel pulse generator that receives pixel data Dp in series which are elements of an image and produces a pulse-width modulation signal Pw in response to each of the pixel data Dp; 73 designates a laser diode driver that receives the pulse-width modulation signal Pw and outputs a drive signal; 61 designates a laser diode that receives the drive signal and emits a light beam in response to the drive signal; and 62 designates a photoconductive drum on which the beam emitted by the laser diode 61 is thrown so that a latent electrostatic image is formed as the charge distribution corresponding to the scanning of the emitted beam.

The reference numeral 63 designates a pulse control signal generator that receives the serial pixel data Dp and outputs, pixel by pixel, gray scale data Dg and an intra-pixel draw position control signal Sp; 64 designates a fundamental clock generator for generating a fundamental clock signal CLK associated with draw timings of individual pixels by the laser diode 61; 65 designates a level signal generator for generating a level signal Lsg in response to the gray scale data Dg; 66 designates a triangular wave generator that receives the fundamental clock signal CLK and the intra-pixel draw position control signal Sp, and selects one of three triangular waves synchronized with the fundamental clock signal CLK to be output as an output triangular wave Tw; and 67 designates a comparator that compares the output triangular wave Tw with the level signal Lsg, and outputs a pulse-width control signal Pw while the output triangular wave Tw exceeds the level signal Lsg.

Next, the operation of the conventional system will be described.

FIG. 17 is a timing chart showing relationships between various signals of the conventional pixel pulse generator 60. In FIG. 17, the symbol CLK designates the fundamental clock signal CLK; CTRL designates the intra-pixel draw position control signal; 1st-ramp designates a left-hand side triangular wave generated in the triangular wave generator 66, which rises in synchronism with the fundamental clock signal CLK and gradually decreases its level; 2nd-ramp designates a central triangular wave generated in the triangular wave generator 66, which starts a gradual increase in its level in synchronism with the rise of the fundamental clock signal CLK, reaches a peak at around the middle of the period of the fundamental clock signal CLK, and then gradually decreases its level; and 3rd-ramp designates a right-hand side triangular wave generated in the triangular wave generator 66, which gradually increases its level with the fundamental clock signal CLK, and reaches a peak at the next rise of the fundamental clock signal CLK.

Receiving the first fundamental clock pulse CLK at time t1, the triangular wave generator 66 generates the left-hand side triangular wave in response to the intra-pixel draw position control signal Sp, and supplies it to the comparator 67 as the output triangular wave. At the same time, the level signal generator 65 supplies the comparator 67 with the level signal Lsg corresponding to the gray scale data Dg. The comparator 67 compares the left-hand side triangular wave with the level signal Lsg, and outputs the pulse-width control signal Pw in response to the compared result from the rise time t1 of the fundamental clock signal CLK. Thus, the laser diode 61 emits the beam during the high level of the pulse-width control signal Pw so that the charge distribution changes at an upstream portion of the first pixel draw region on the photoconductive drum 62, while the emitted beam scans the photoconductive drum 62.

Receiving the second fundamental clock pulse CLK at time t2, the triangular wave generator 66 generates the central triangular wave in response to the intra-pixel draw position control signal Sp. The comparator 67 compares the central triangular wave with the level signal Lsg before and after the center of the fundamental clock pulse CLK, and outputs the pulse-width control signal Pw in response to the compared result. Thus, the charge distribution changes at the central portion of the first pixel draw region on the photoconductive drum 62.

Likewise, at time t3 when the third fundamental clock pulse CLK is generated, the right-hand side triangular wave is compared with the level signal Lsg, and the charge distribution changes at the downstream portion of the first pixel draw region on the photoconductive drum 62. Subsequently, at time t4 when the fourth fundamental clock pulse is generated, the left-hand side triangular wave is compared with the level signal Lsg, and the charge distribution changes at the upstream portion of the second pixel draw region on the photoconductive drum 62.

In this way, the charge distribution, that is, a latent electrostatic image is formed on the photoconductive drum 62 in response to the pulse-width control signal Pw. The image forming apparatus forms at a high speed a high resolution, high gradation output image based on the latent electrostatic image.

The conventional pixel pulse generator 60, however, cannot be implemented as an integrated circuit through a CMOS process because it includes the triangular wave generator 66 consisting of an analog circuit.

In view of this, it will be possible to generate the pulse-width modulation signal by a phase conversion circuit as shown in FIG. 18, which consists of only digital circuit components and hence can be formed through the CMOS process. In FIG. 18, the reference numeral 68 designates an input terminal to which a high frequency clock signal Ch with a frequency of an integer multiple of the fundamental clock signal CLK is applied; 69 designates a counter to which the high frequency clock signal is input along with a reset signal Rst and a phase set signal Pst; 70 designates an AND gate that ANDs the high frequency clock signal Ch and the output Ct of the counter 69; 71 designates a frequency divider for dividing the output of the AND gate 70 so that its output period becomes equal to the period of the fundamental clock signal CLK; and 72 designates an output terminal for producing the output of the frequency divider 71 as the phase converted clock signal Cp.

Next, the operation of the conventional circuitry as shown in FIG. 18 will be described.

FIG. 19 is a timing chart illustrating relationships between various signals of the phase conversion circuit when the phase set signal is set at "3". The counter 69 starts counting of the high frequency clock signal Ch when the reset signal Rst is removed in synchronism with the fundamental clock signal CLK. When the count value reaches "3", the counter 69 changes the output Ct to a high level so that the AND gate 70 starts to output the high frequency clock signal Ch. Then, the frequency divider 71 divides the high frequency clock signal Ch such that its period becomes equal to the period of the fundamental clock signal CLK, and outputs it as the phase converted clock signal Cp.

As a result, the phase conversion circuit can output the phase converted clock signal Cp whose phase is shifted by an amount corresponding to three high frequency clock pulses with respect to the fundamental clock signal CLK.

However, the following problems arises from applying such a phase conversion circuit to a today's image forming apparatus that must meets the demand of producing high gradation (of more than 256 gray levels), high resolution images at a high speed. First, a very high frequency is required of the high frequency clock signal Ch. In addition, this requires a fast-response counter, an AND gate and a frequency divider that can operate quickly in response to the high frequency clock signal Ch. Thus, the conventional phase conversion circuit is not always the image forming apparatus.

SUMMARY OF THE INVENTION

The present invention is implemented to solve the foregoing problem. It is therefore an object of the present invention to provide a clock signal generator and a clock phase controller which can be fabricated through the CMOS process, and are suitably used for controlling the light emitting device such as a laser diode in an electrophotographic image forming apparatus like a laser printer.

According to a first aspect of the present invention, there is provided a pulse-width modulation signal generator including a clock signal generator which receives a clock signal and generates a plurality of main delay clock signals whose period is identical to a period of the clock signal and whose phases differ from each other, the pulse-width modulation signal generator generating a pulse-width modulation signal using the plurality of main delay clock signals, the clock signal generator comprising: a pre-delay circuit sequence that includes a plurality of pre-delay circuits connected in cascade, and receives the clock signal; a pre-delay controller for comparing two of pre-delay clock signals output from the plurality of pre-delay circuits, and for controlling to maintain at a fixed value a phase difference between the two compared pre-delay clock signals; and a plurality of main delay circuit sequences, each of which includes a plurality of main delay circuits connected in cascade, and receives one of the pre-delay clock signals, wherein a number of the pre-delay circuits connected in cascade in the pre-delay circuit sequence is greater than a number of the main delay circuits connected in cascade in each of the plurality of main delay circuit sequences.

According to a second aspect of the present invention, there is provided a pulse-width modulation signal generator including a clock signal generator which receives a clock signal and generates a plurality of main delay clock signals whose period is identical to a period of the clock signal and whose phases differ from each other, the pulse-width modulation signal generator generating a pulse-width modulation signal using the plurality of main delay clock signals, the clock signal generator comprising: a pre-delay circuit sequence that includes a plurality of pre-delay circuits connected in cascade, and receives the clock signal; a pre-delay controller for comparing two of pre-delay clock signals output from the plurality of pre-delay circuits, and for controlling to maintain at a fixed value a phase difference between the two compared pre-delay clock signals; a plurality of main delay circuit sequences, each of which includes a plurality of main delay circuits connected in cascade, and receives one of the pre-delay clock signals; a plurality of middle delay circuits, each of which is connected between the pre-delay circuit sequence and one of the plurality of main delay circuit sequences, and delays one of the pre-delay clock signals to be output, wherein each of the pre-delay clock signals is supplied to at least one of the plurality of main delay circuit sequences directly, and to at least another of the plurality of the main delay circuit sequences through one of the middle delay circuits.

Here, the pre-delay circuit sequence may comprise (N+1) pre-delay circuits, where N is a number of the pre-delay clock signals, and wherein the pre-delay controller may comprise: a phase comparator for comparing an output of an initial pre-delay circuit with an output of a final pre-delay circuit of the pre-delay circuits connected in cascade, and outputs a phase compared signal corresponding to a phase difference between the two inputs; a charge pump for storing a charge current in response to the phase compared signal; and a control circuit for controlling a delay amount of the pre-delay circuits in response to an integral of the charge current.

The pulse-width modulation signal generator may further comprise a dividing ratio selector which receives at least two of successive pre-delay clock signals output from a second to the final pre-delay circuits in the pre-delay circuit sequence, and selects one of the pre-delay clock signals as a selected delay clock signal, wherein the pre-delay controller may receive the selected delay clock signal instead of the output of the final pre-delay circuit.

Each of the plurality of pre-delay circuits may comprise a plurality of delay elements which are formed in a CMOS process and are connected in cascade, and a delay time selector for selecting one of outputs of the plurality of delay elements.

The pulse-width modulation signal generator may further comprise a sub-delay circuit sequence which includes a plurality of sub-delay circuits connected in cascade, and receives a sub-clock signal; and a sub-delay controller which compares two sub-delay clock signals output from the plurality of sub-delay circuits, and carries out control to maintain a phase difference between the two sub-delay clock signals at a fixed value, wherein the sub-delay controller may supply its control signal to the plurality of main delay circuits.

The pulse-width modulation signal generator may further comprise an external terminal for receiving the sub-clock signal from an outside.

The pulse-width modulation signal generator may further comprise a sub-clock generator which receives at least one of the clock signal and the pre-delay clock signals, and generates the sub-clock signal whose period is longer than the clock signal.

BRIEF DESCRIPTION OF THE DRAWINGS

FIGS. 9A and 9B are block diagrams showing a configuration of the pre-phase converter 9 of an embodiment 3 of the pulse-width modulation signal generator in accordance with the present invention;

FIG. 11 is a circuit diagram showing a configuration of a sub-clock generator 35 of the embodiment 4;

FIG. 12 is a table showing relationships between an output S0–S2 of a 3-bit counter 35j and the selecting operation of a selector in the embodiment 4;

FIG. 14 is a block diagram showing a configuration of the main phase converter 10 of an embodiment 5 of the pulse-width modulation signal generator in accordance with the present invention;

FIGS. 15A and 15B are circuit diagrams showing a configuration of a middle delay circuit of the embodiment 5;

FIG. 19 is a timing chart showing an operation example of the phase conversion circuit of FIG. 18.

DETAILED DESCRIPTION OF THE PREFERRED EMBODIMENTS

The invention will now be described with reference to the accompanying drawings.

EMBODIMENT 1

Figure 1:
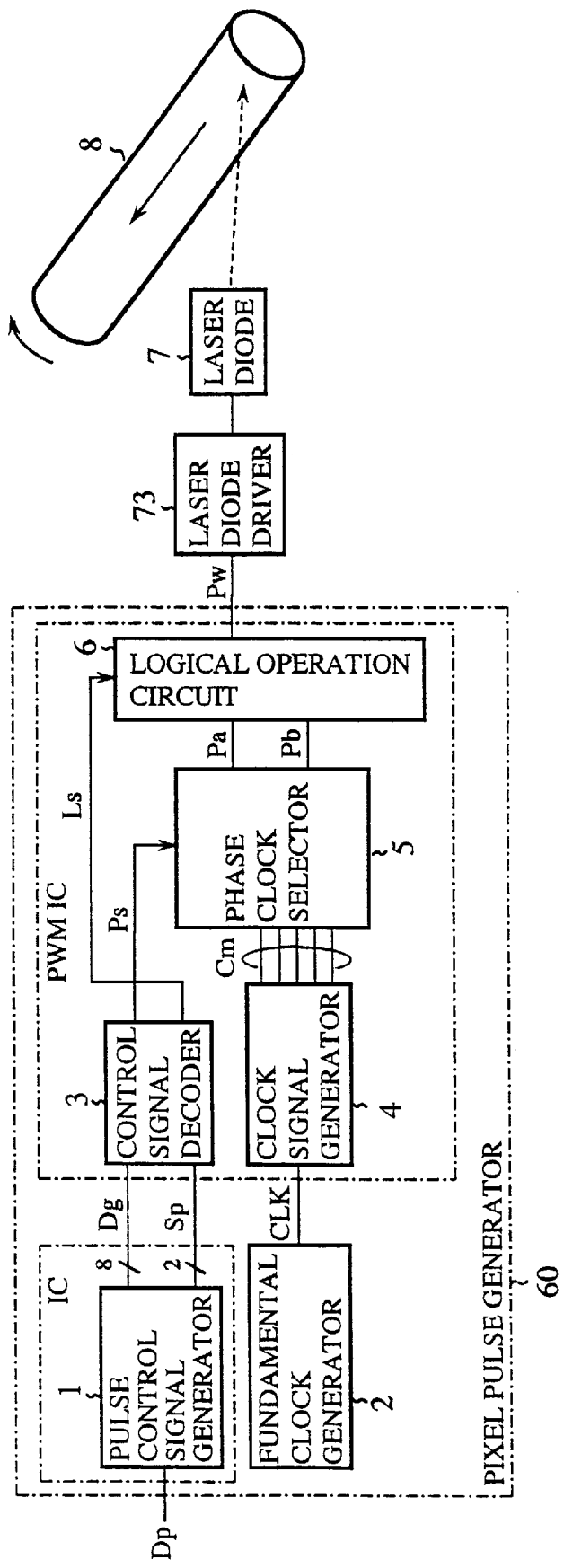
FIG. 1 is a block diagram showing a configuration of the image output portion of a laser printer to which an embodiment 1 is applied of a pulse-width modulation signal generator in accordance with the present invention.

FIG. 1 is a block diagram showing a configuration of an image output portion of a laser printer, to which an embodiment 1 is applied of the pulse-width modulation signal generator in accordance with the present invention. In FIG. 1, the reference numeral 60 designates a pixel pulse generator that receives pixel data Dp in series, constituting elements of an image, and produces a pulse-width modulation signal Pw in response to the pixel data Dp; 73 designates a laser diode (LD) driver that receives the pulse-width modulation signal Pw and outputs a drive signal; 7 designates a laser diode that receives the drive signal and emits a light beam in accordance with the pulse width of the pulse-width modulation signal Pw; and 8 designates a photoconductive drum on which the light beam emitted from the laser diode 7 is thrown so that a latent electrostatic image is formed as the charge distribution corresponding to the scanning of the emitted light beam.

The reference numeral 1 designates a pulse control signal generator that receives the serial pixel data Dp and outputs, pixel by pixel, gray scale data Dg and an intra-pixel draw position control signal Sp; 2 designates a fundamental clock generator for generating a fundamental clock signal CLK whose frequency is set in accordance with a draw timing of each pixel by the laser diode 7; 3 designates a control signal decoder that includes data corresponding to input/output data, and outputs a clock selection signal Ps and a logical operation selection signal Ls in response to the gray scale data Dg and intra-pixel draw position control signal Sp; 4 designates a clock signal generator that receives the fundamental clock signal CLK and outputs a plurality of phase clock signals Cm each having the same period as that of the fundamental clock signal CLK and a phase different from each other; 5 designate a phase clock selector that receives the plurality of phase clock signals Cm and the clock selection signal Ps, and selects a pair of phase clock signals in accordance with the clock selection signal Ps to output them as phase converted clock signals Pa and Pb; and 6 designates a logical operation circuit that receives the logical operation selection signal Ls and the pair of the phase clock signals Pa and Pb, carries out on the pair of the phase clock signals Pa and Pb the logical operation selected by the logical operation selection signal Ls, and supplies its result to the laser diode driver 73 as the pulse-width modulation signal Pw.

The pulse control signal generator 1 is formed into an IC (integrate circuit) by a CMOS process, and the control signal decoder 3, clock signal generator 4, phase clock selector 5 and logical operation circuit 6 are also formed in their entirety into a pulse-width modulation integrated circuit (PWM IC) by a CMOS process. These ICs are usually mounted on an image processing circuit board, and sometimes on a printer card on which a laser diode is mounted.

Figure 2:
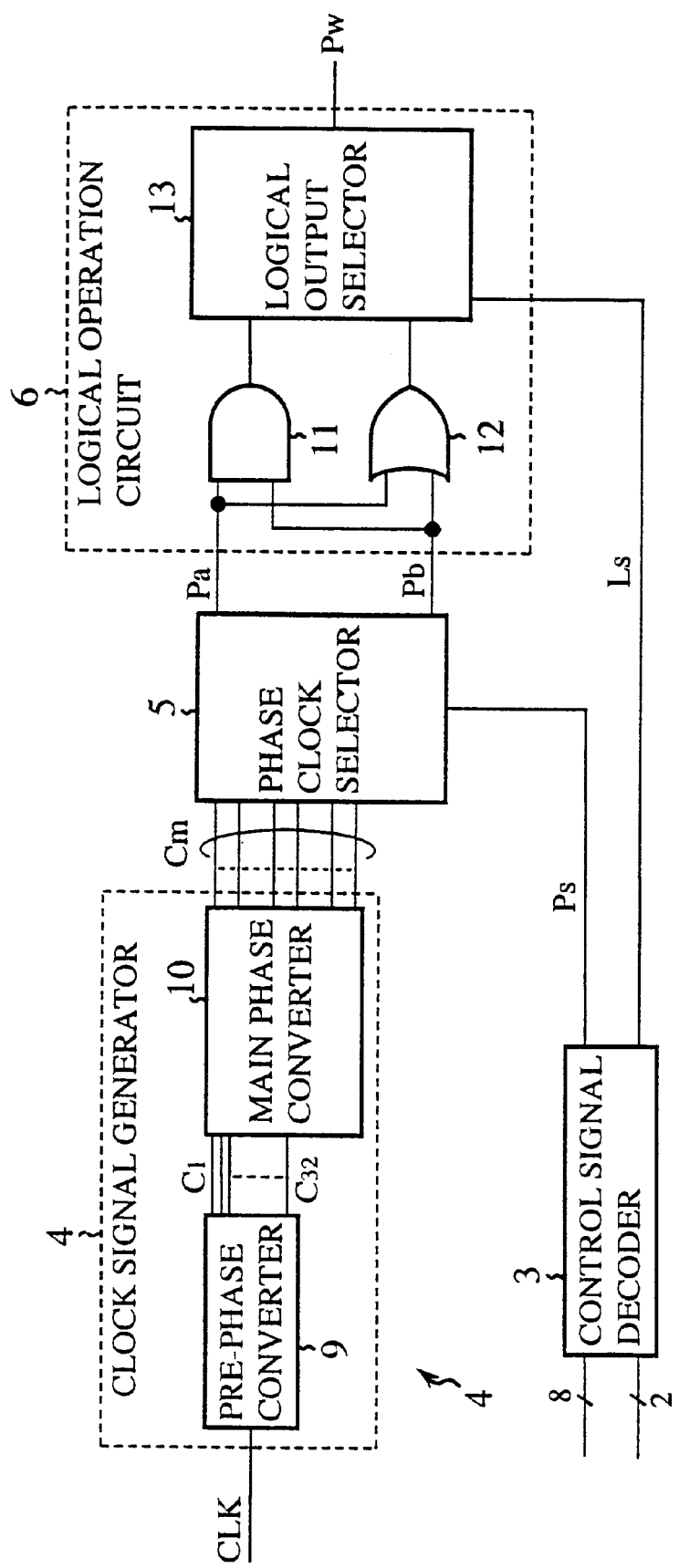
FIG. 2 is a block diagram showing a configuration of the embodiment 1 of a pulse-width modulation IC in accordance with the present invention.

FIG. 2 is a block diagram showing a configuration of the embodiment 1 of the pulse-width modulation integrated circuit in accordance with the present invention. In FIG. 2, the reference numeral 9 designates a pre-phase converter which receives the fundamental clock signal CLK from the fundamental clock generator 2, and generates N (=32) pre-delay clock signals C1–C32 whose phases differ from each other; and 10 designates a main phase converter that receives the 32 pre-delay clock signals C1–C32, and generates eight main delay clock signals for each pre-delay clock signal Ci (i=1–32), thereby producing 256 main delay clock signals Cm in total. The pre-phase converter 9 and main phase converter 10 constitute the clock signal generator 4. The reference numerals 11 and 12 designate a logical AND gate to which two phase converted clock signals Pa and Pb are input, 12 designates a logical OR gate to which the same clock signals are input, and 13 designates a logical output selector that selects one of the two outputs of the logic gates 11 and 12, and outputs it as the pulse-width modulation signal Pw. Since the remaining configuration is the same as that of FIG. 1, its description is omitted here.

Next, the overall operation of the image output portion of the laser beam printer will be described with reference to the foregoing drawings.

The clock signal generator 4 generates 256 phase clock signals Cm in response to the fundamental clock signal CLK generated by the fundamental clock generator 2.

Receiving the serial pixel data Dp in this state, the pulse control signal generator 1 outputs the 8-bit gray scale data signal Dg and 2-bit intra-pixel draw position control signal Sp for each pixel data Dp. The control signal decoder 3 retrieves the corresponding data in response to the gray scale data signal Dg and intra-pixel draw position control signal Sp, and outputs a clock selection signal Ps and logical operation selection signal Ls in response to the corresponding data.

Thus, the phase clock selector 5, receiving the 256 phase clock signals Cm and the clock selection signal Ps, selects two of the 256 phase clock signals Cm in response to the clock selection signal Ps, and outputs them as two phase converted clock signals Pa and Pb. Besides, the logical operation circuit 6, receiving the logical operation selection signal Ls and the two phase converted clock signals Pa and Ps, selects in response to the logical operation selection signal Ls one of the two logical operation results, that is, the logical AND and OR operation results, and outputs it as a pulse-width control signal Pw. Then, the laser diode driver 73 drives the laser diode 7 in response to the pulse-width control signal Pw to irradiate the photoconductive drum 8, thereby forming at a particular pixel area on the photoconductive drum 8 the charge distribution corresponding to the pixel data.

Repeating such process for each pixel data over the entire image, the laser printer can form on the photoconductive drum 8 the charge distribution, that is, a latent electrostatic image in response to the pulse-width control signal Pw. Then, a high gradation (256 gray levels, for example), high resolution output image is formed from the latent electrostatic image.

Next, the clock signal generator 4 will be described in detail.

Figure 3:
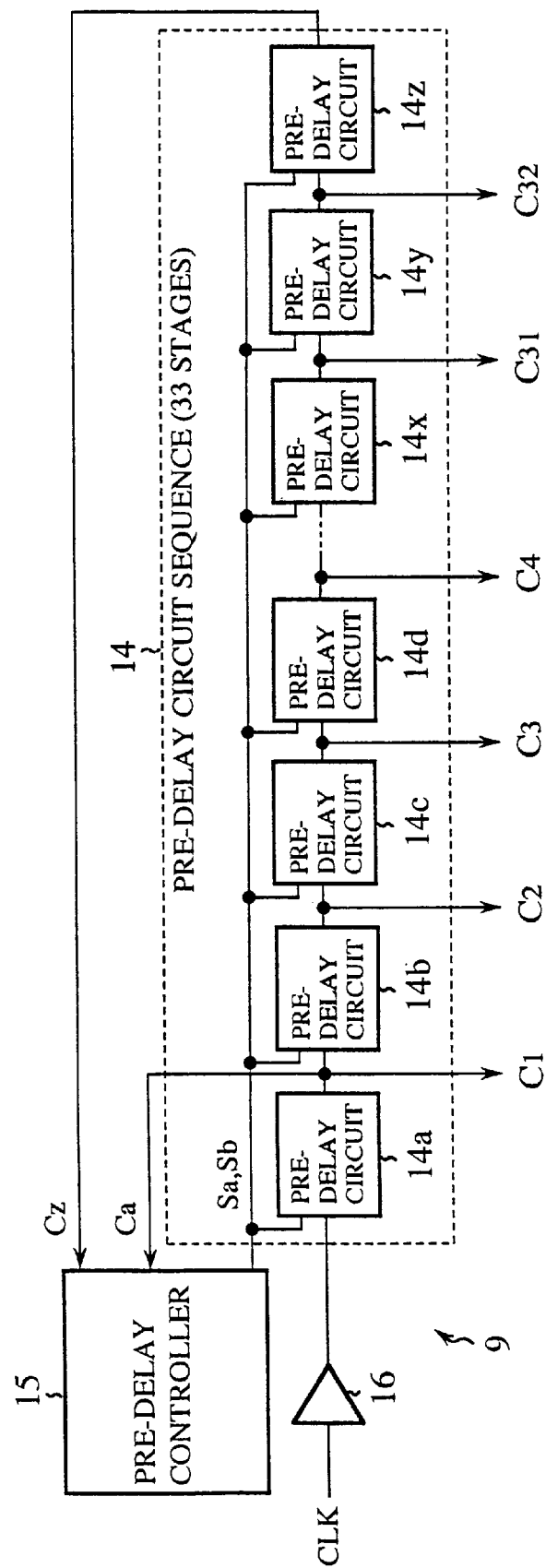
FIG. 3 is a block diagram showing a configuration of a pre-phase converter 9 of the embodiment 1.

FIG. 3 is a block diagram showing a configuration of the pre-phase converter 9 in the present embodiment 1. In FIG. 3, the reference numeral 14 designates a pre-delay circuit sequence that consists of 33 pre-delay circuits 14a–14z connected in cascade, and receives the fundamental clock signal CLK at the initial pre-delay circuit 14a. The reference numeral 15 designates a pre-delay controller which receives the output Ca of the initial pre-delay circuit 14a and the output Cz of the final (33rd) pre-delay circuit 14z, and provides the pre-delay circuits 14a–14z with pre-delay control signals Sa and Sb such that the phase difference between the two signals Ca and Cz is eliminated; and 16 designates a clock input buffer for amplifying the fundamental clock signal CLK supplied to the pulse-width modulation integrated circuit.

Figure 4A:
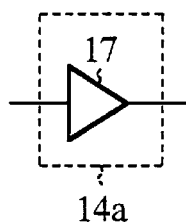
FIGS. 4A and 4B are circuit diagrams showing a tr configuration of a pre-delay circuit 14a of the embodiment 1.
Figure 4B:
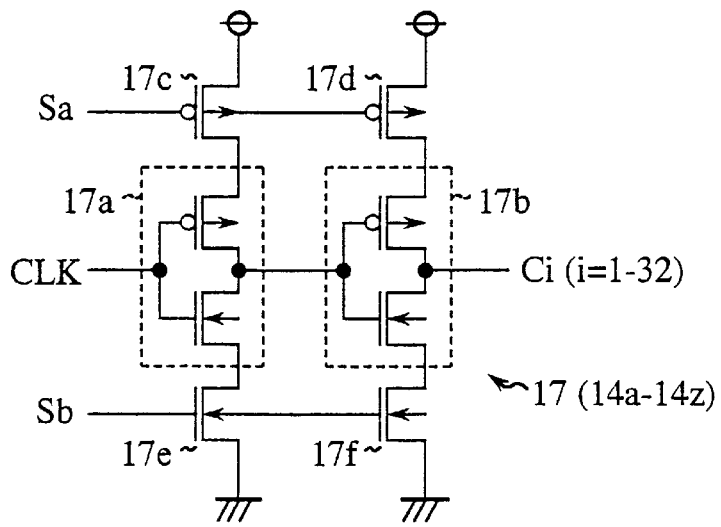

FIGS. 4A and 4B are circuit diagrams showing a configuration of the pre-delay circuit 14a (and 14b–14z) of the present embodiment 1. As shown in FIG. 4A, the pre-delay circuit 14a consists of a buffer (delay element) 17 whose configuration is shown in FIG. 4B. In FIG. 4B, the reference numerals 17a and 17b each designate a CMOS inverter consisting of a pMOS transistor and an nMOS transistor; 17c and 17d each designate a high potential side current control transistor consisting of a pMOS transistor connected between a high potential power supply and the CMOS inverter 17a or 17b; and 17e and 17f each designate a low potential side current control transistor consisting of an NMOS transistor connected between the CMOS inverter 17a or 17b and a low potential power supply. The two CMOS inverters 17a and 17b are connected in cascade.

Figure 5A:
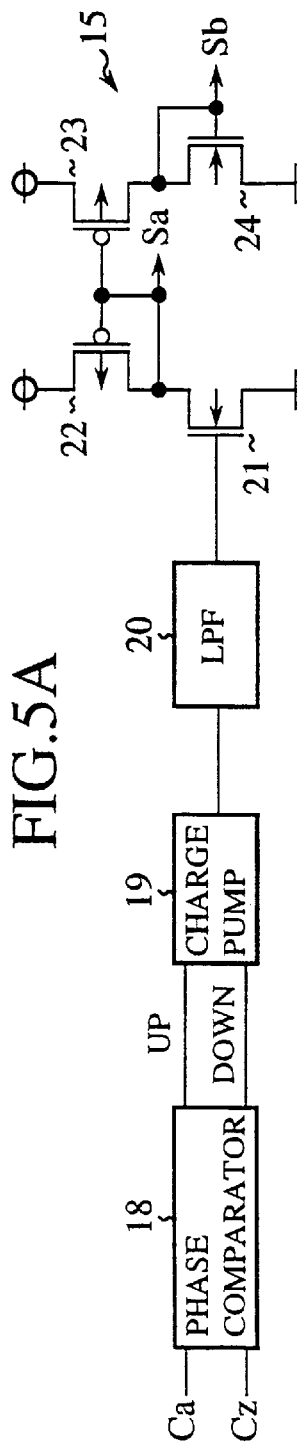
FIGS. 5A and 5B are circuit diagrams showing a detailed configuration of a pre-delay controller 15 of the embodiment 1.
Figure 5B:
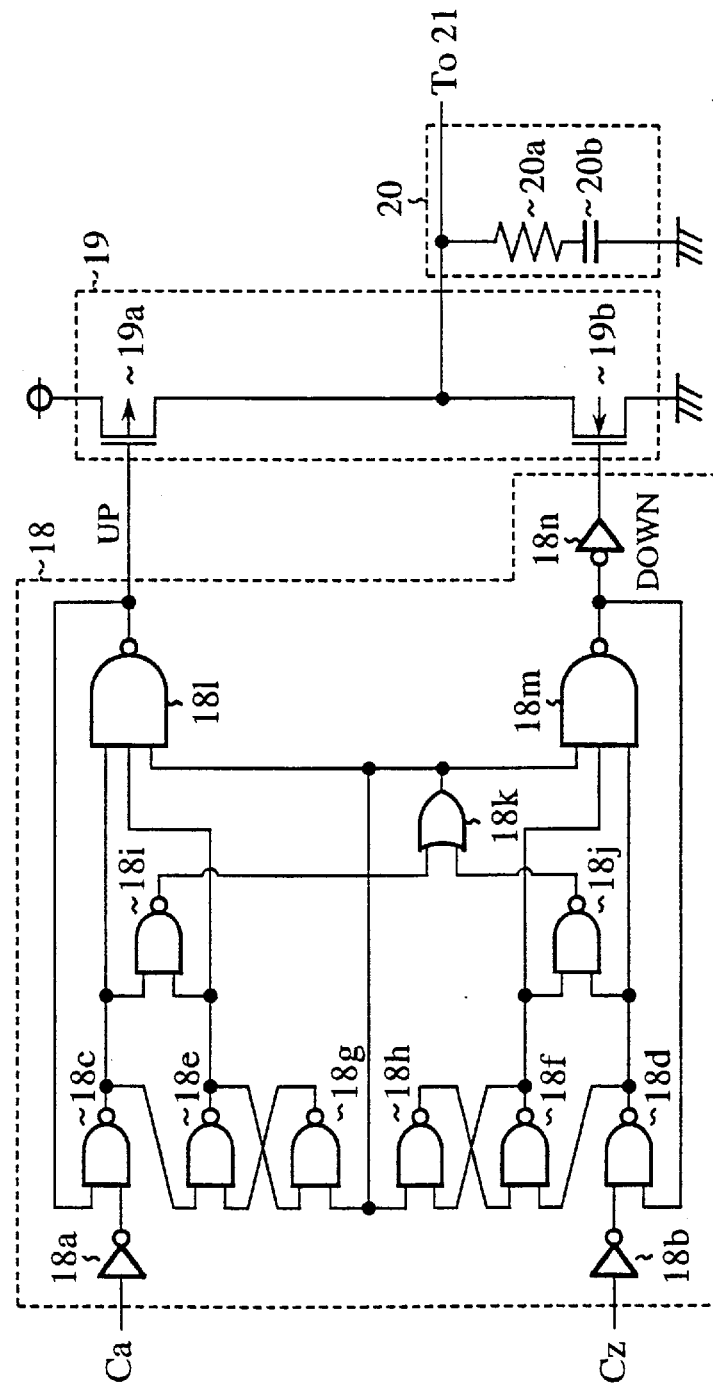

FIGS. 5A and 5B are circuit diagrams showing a configuration of the pre-delay controller 15 in detail. In FIG. 5A, the reference numeral 18 designates a phase comparator that receives the pre-delay clock signals Ca and Cz output from the initial pre-delay circuit 14a and final pre-delay circuit 14z, and outputs increment pulse UP or decrement pulse DOWN in response to the phase difference between the two inputs. The reference numeral 19 designates a charge pump that receives the increment pulse UP or decrement pulse DOWN, and generates a charge current in response to them; and 20 designates a low-pass filter for generating a voltage corresponding to an accumulation of the charge current. The reference numeral 21 designates a drive transistor having its gate supplied with the voltage the low-pass filter 20 outputs, and its source connected to the low potential power supply; and 22 designate a high-potential side transistor consisting of a pMOS transistor having its drain and gate connected to the drain of the drive transistor 21 and its source connected to the high potential power supply. The reference numeral 23 designates an inverting transistor consisting of a pMOS transistor having its gate connected to the gate of the high-potential side transistor 22; and 24 designates a low-potential side transistor having its drain and gate connected to the drain of the inverting transistor 23 and its source connected to the low potential power supply. The pre-delay control signals Sa and Sb output from the pre-delay controller 15 are supplied to the high-potential side current control transistors 17c and 17d, and the low-potential side current control transistor 17e and 17f of the pre-delay circuits 14a–14z, respectively, as shown in FIG. 4B. The configuration of the pre-delay controller 15 is not restricted to the PLL circuit described here.

In FIG. 5B, the reference numeral 18a designates an initial side inverter to which the pre-delay clock signal Ca output from the initial pre-delay circuit 14a is input; and 18b designates a reference side inverter 18b to which the pre-delay clock signal Cz output from the final pre-delay circuit 14z is input. The reference numerals 18c and 18d each designate a NAND gate for performing a logical NAND operation between one of the outputs of the phase comparator 18 and the output of the inverters 18a or 18b. The reference numerals 18e and 18g designate an SR flip-flop which is set by the output of the NAND gate 18c and is reset by the output of an OR gate 18k; and 18f and 18h designate an SR flip-flop which is set by the output of the NAND gate 18d and is reset by the output of the OR gate 18k. The reference numerals 18i, 18j and 18k designate logic gates for producing a low level reset pulse of the flip-flops when both the pre-delay clock signals Ca and Cz becomes a high level. The reference numerals 18l, 18m and 18n each designate an output control elements for operating the charge pump 19 when the outputs of the gates 18c, 18e and 18k are all placed at a high level, or the outputs of the gates 18d, 18f and 18k are all placed at the high level. This means that when the pre-delay clock signal Ca falls to the low level prior to the pre-delay clock signal Cz, that is, when the phase of the pre-delay clock signal Ca advances as compared with that of the pre-delay clock signal Cz, the gate 18l outputs the phase compared signal UP, and that when the phase of the pre-delay clock signal Cz advances as compared with that of the pre-delay clock signal Ca, the inverter 18n outputs the phase compared signal DOWN.

The reference numeral 19a designates a charge-up transistor for generating a charge current in accordance with the level of the phase compared signal UP applied to its gate, and the reference numeral 19b designates a charge-down transistor for drawing the charge current in accordance with the level of the phase compared signal DOWN applied to its gate. The reference numeral 20b designates a charge-up capacitor 20b that generates a voltage corresponding to a cumulative value of the charge current, and 20a designates a buffer resistor for regulating the voltage change of the charge-up capacitor 20b.

Next, the operation of the pre-phase converter 9 will be described in detail.

When the fundamental clock signal CLK is input to the pre-delay circuit sequence 14 through the clock input buffer 16, the second CMOS inverters 17b of the pre-delay circuits 14a–14z sequentially output a pre-delay clock signal Ci. Thus, the final pre-delay circuit 14z outputs the pre-delay clock signal Cz after about one period of the fundamental clock signal CLK has elapsed. Thus, the phase comparator 18, receiving the two pre-delay clock signals Ca and Cz, starts the phase comparison. Specifically, the phase comparator 18 outputs the decrement pulse DOWN when the phase of the pre-delay clock signal Cz leads that of the pre-delay clock signal Ca, and the increment pulse UP when the phase of the pre-delay clock signal Cz lags behind that of the pre-delay clock signal Ca. In response to this, the charge pump 19 supplies the charge-up capacitor 20b with the charge current when the increment pulse UP is input, while it discharges the charge-up capacitor 20b when the decrement pulse DOWN is input. The output of the charge pump 19 is supplied to the gate of the drive transistor 21. Thus, the drive transistor 21 and inverting transistor 23 output the control signals Sa and Sb which are supplied to the high-potential side current control transistors 17c and 17d and low-potential side current control transistors 17e and 17f of the respective pre-delay circuits.

In this way, the charge-up capacitor 20b is charged in accordance with an amount of the phase difference between the pre-delay clock signals Ca and Cz, and hence the control signals Sa and Sb vary in response to changes in the phase difference. Thus, the transistors 17c–17f controls the current flowing through the CMOS inverters 17a and 17b, which in turn varies the operation speed of the CMOS inverters. As a result, the phases of the pre-delay clock signals Ca and Cz are controlled to be aligned.

Figure 6:
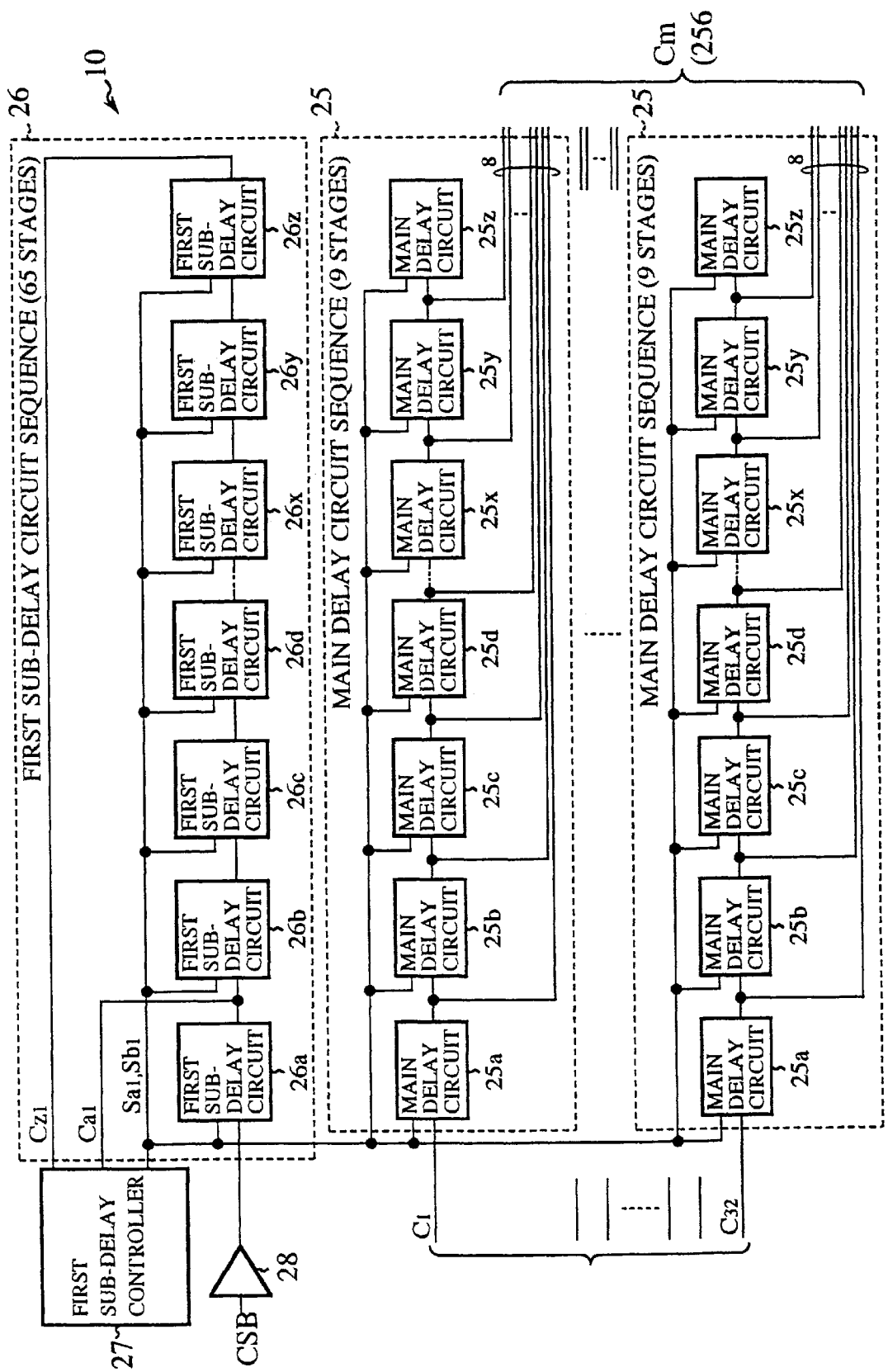
FIG. 6 is a block diagram showing a detailed configuration of a main phase converter 10 of the embodiment 1.

FIG. 6 is a block diagram showing a configuration of the main phase converter 10 in detail. In FIG. 6, reference numerals 25 each designate a main delay circuit sequence that includes nine main delay circuits 25a–25z connected in cascade, and there are 32 main delay circuit sequences 25 in total. The reference numeral 26 designates a first sub-delay circuit sequence (sub-delay circuit sequence) including 65 first sub-delay circuits (sub-delay circuits) 26a–26z. The reference numeral 27 designates a first sub-delay controller (sub-delay controller) which receives the output Ca1 of the initial first sub-delay circuit 26a and the output Cz1 of the final first sub-delay circuit 26z, and outputs sub-delay control signals Sa1 and Sb1 corresponding to the phase difference between the two input signals Ca1 and Cz1. The reference numeral 28 designates a sub-clock buffer for supplying the first sub-delay circuit sequence 26 with a sub-clock signal CSB which is externally input to the pulse-width control IC. The 32 main delay circuit sequences 25 have one-to-one correspondence with the pre-delay clock signals C1–C32, and each of them, receiving the sub-delay control signals Sa1 and Sb1 and one of the pre-delay clock signals C1–C32, outputs eight main delay clock signals which amounts to 256 main delay clock signals Cm in total. The delay circuits 26z–26z, 25a–25z and first sub-delay controller 27 have substantially the same internal configurations as their counterparts of the pre-phase converter 9, and hence the description thereof is omitted here.

Next, the operation of the main phase converter 10 will be described in detail.

When the sub-clock signal CSB is input, the sub-clock buffer 28 supplies it to the first sub-delay circuit sequence 26. Thus, the first sub-delay circuits 26a–26z successively delay the sub-clock signal CSB by a certain time period, and when the final first sub-delay circuit 26z outputs the clock signal Cz1, the first sub-delay controller 27 compares the phase of the output Ca1 of the initial first sub-delay circuit 26a with that of the output Cz1 of the final first sub-delay circuit 26z. Thus, the first sub-delay controller 27 outputs the sub-delay control signals Sa1 and Sb1 such that the phases of the two subdelay clock signals Ca1 and Cz1 coincide with each other. As a result, the delay time of each of the first sub-delay circuits 26a–26z and main delay circuits 25a–25z is set at 1/64 of the period of the sub-clock signal CSB.

When the pre-delay clock signals C1–C32 are input to the main delay circuit sequences 25 in this state, they each output eight main delay clock signals Cm with their phases successively shifting by 1/64 of the period of the sub-clock signal CSB.

Figure 7:
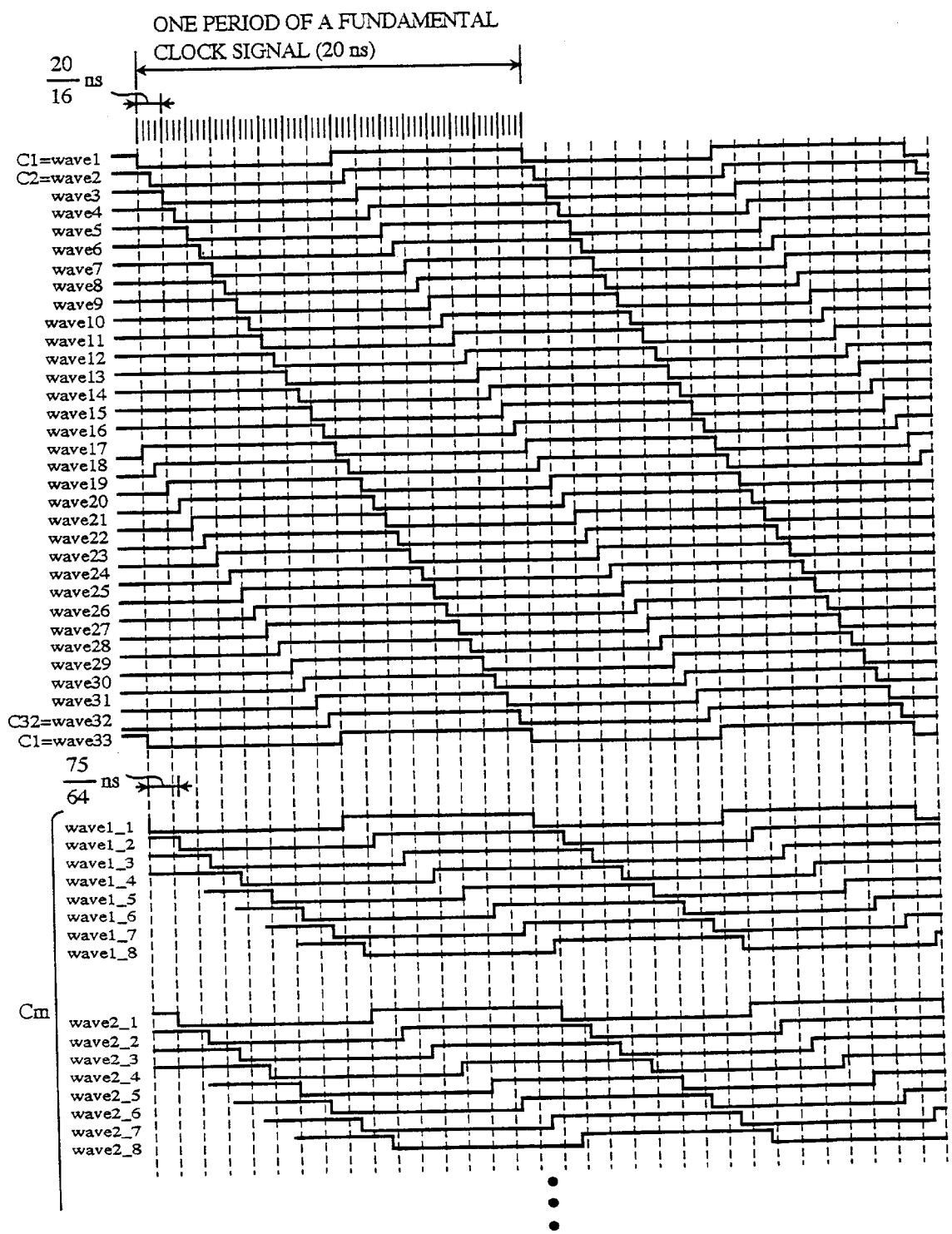
FIG. 7 is a timing chart showing timing relationships between pre-delay clock signals C1–C32 and main clock signals Cm when a clock signal generator is supplied with a fundamental clock signal CLK whose period is 20 ns (50 MHz) and a sub-clock signal CSB whose period is 75 ns (13.3 MHz)

FIG. 7 is a timing chart illustrating the timings of the pre-delay clock signals C1–C32 and part of the main delay clock signals Cm, when the period of the fundamental clock signal CLK is 20 ns (50 MHz), and that of the sub-clock signal CSB is 75 ns (13.3 MHz). In FIG. 7, wave1–wave33 are waveforms of the pre-delay clock signals C1–C32 and C1, and wave1_1–wave1_8 are waveforms of the main delay clock signals Cm output from the first main delay circuit sequence 25 to which the first pre-delay clock signal C1 is input, wave2_1–wave2_8 are waveforms of the main delay clock signals Cm output from the second main delay circuit sequence 25 to which the second pre-delay clock signal C2 is input, etc. In this state, the phase difference between the adjacent pre-delay clock signals C1–C32 becomes 20/32 ns, and that of the adjacent main delay clock signals Cm becomes 75/64 ns, and seven main delay clock signals Cm are output between any two adjacent pre-delay clock pulses C1–C32. Thus, the clock signal generator 4 generates 256 main delay clock signals Cm whose phases differ from each other.

As described above, the present embodiment 1 comprises the pre-delay circuit sequence 14 to which the fundamental clock signal CLK is input, and the plurality of main delay circuit sequences 25 to which the pre-delay clock signals C1–C32 output from the pre-delay circuit sequence 14 are input, and the delay time of the pre-delay circuits 14a–14z constituting the pre-delay circuit sequence 14 is set at a value different from that of the main delay circuits 25a–25z constituting the main delay circuit sequence 25. This offers an advantage that a plurality of phase clock signals with different phases are easily generated.

In addition, the combination of the pre-delay circuit sequence 14 and the main delay circuit sequences 25, which is formed for generating the main delay clock signals Cm on the basis of the pre-delay clock signals C1–C32, can generate the phase converted clock signals whose phases shift from each other by an amount corresponding to a time smaller than the minimum delay times of the delay circuits 14a–14z and 25a–25z, each of which is formed by combining the two CMOS inverters 17a and 17b formed through the CMOS process. The minimum delay times of the delay circuits 14a–14z and 25a–25z are about one nanosecond in the pulse-width control IC of the present embodiment 1 based on 0.5 micron design rule. To achieve 256 gray levels using the fundamental clock signal CLK of 50 MHz, however, phase converted clock signals with their phases shifting by 0.08 ns each, which can be implemented in the present embodiment 1. As a result, the light emission of the laser diode 7 of the laser printer can be controlled to satisfy such requirement.

According to the present embodiment 1, the pre-delay circuit sequence 14 comprises (N+1) pre-delay circuits 14a–14z, where N is the number of the pre-delay clock signals, which enables the pre-delay clock signals Ca and Cz to be output from the initial pre-delay circuit 14a and the final pre-delay circuit 14z, respectively, which have the same configuration. This enables the pre-delay controller 15 of the present embodiment to detect the phase difference by comparing the pre-delay clock signal Ca and Cz having waveforms very similar to each other. In contrast with this, if the pre-delay circuit sequence includes only N pre-delay circuits, the pre-delay controller 15 must compare the output of the final pre-delay circuit Cz with the output of the clock buffer 16 to detect the phase difference, in which case the two waveforms to be compared will be not very similar to each other. Thus, the present embodiment enables the pre-delay controller 15 to achieve accurate control of the delay amount of the pre-delay circuit sequence 14, which in turn makes it possible to establish more accurate phase differences of the clock signals for generating 256 phase converted clock signals for forming 256 gray level images.

Furthermore, the present embodiment 1 generates the 256 main delay clock signals Cm by first shifting the fundamental clock signal CLK by 32 steps through the pre-delay circuit sequence 14 whose delay time is controlled by the PLL configuration, and then by shifting each of the 32 phase shifted clock signals C1–C32 by eight steps through the main delay circuit sequence 25. This makes it possible to reduce timing errors of the clock signals due to the variation of the delay elements as compared with the case where the pre-delay circuit sequence 14 and pre-delay controller 15 shift 16 steps each, thereby establishing more accurate intervals between 256 phase converted clock signals generated for forming 256 gray level images.

The present embodiment 1 of the pulse width control IC comprises the first sub-delay circuit sequence 26 to which the sub-clock signal CSB is applied, and the first sub-delay controller 27 which supplies the sub-delay control signals Sa1 and Sb1 to all the main delay circuit sequences 25. This makes it possible to substantially reduce the number of the circuits as compared with the case where the first sub-delay circuit sequence 26 is provided for each main delay circuit sequence 25 to equalize the delay amount of all the main delay circuit sequences 25. As a result, it becomes possible to establish more accurate intervals between 256 phase converted clock signals generated for forming 256 gray level images.

Furthermore, the delay amount of each of the main delay circuits 25a–25z can be set at an amount different from that of the pre-delay circuits 14a–14z by altering the number of sub-delay circuits in the first sub-delay circuit sequence 26 from that of the pre-delay circuit sequence 14, or by setting the frequency of the sub-clock signal CSB different from that of the fundamental clock signal CLK, even when the delay circuits of the main delay circuit sequence 25 and pre-delay circuit sequence 14 are formed using the same mask. This makes it possible for the main delay circuit sequences 25 to output a plurality of main delay clock signals Cm in one period of the pre-delay clock signal, and to improve the resolution easily within a limited circuit scale.

EMBODIMENT 2

Figure 8:
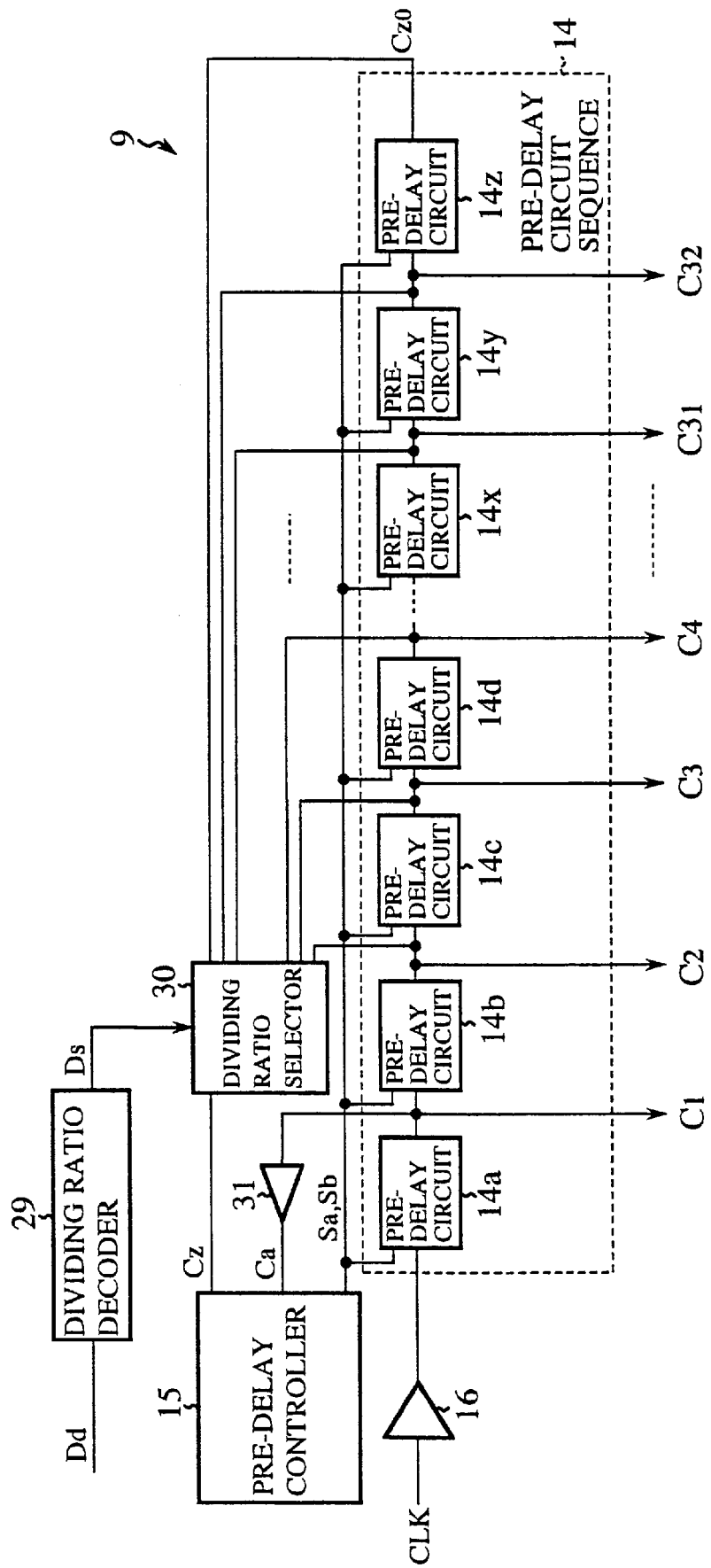
FIG. 8 is a block diagram showing a configuration of the pre-phase converter 9 of an embodiment 2 of the pulse-width modulation signal generator in accordance with the present invention.

FIG. 8 is a block diagram showing the pre-phase converter 9 of an embodiment 2 in accordance with the present invention. In FIG. 8, the reference numeral 29 designates a dividing ratio decoder for decoding a dividing ratio data Dd that is set for the pulse-width control IC. The reference numeral 30 designates a dividing ratio selector which, receiving an output signal Ds of the dividing ratio decoder 29 and the pre-delay clock signals C2–C32 and Cz0 output from a set of 32 pre-delay circuits from the second one 14b to the final one 14z, selects one of the 32 pre-delay clock signals in response to the output signal Ds of the dividing ratio decoder 29, and outputs the selected one as a select delay clock signal Cz. The reference numeral 31 designates a delay circuit with a delay time identical to the transfer delay of the clock signal through the dividing ratio selector 30. Since the remaining configuration is the same as that of the embodiment 1, description thereof is omitted here by designating the corresponding portions by the same reference numerals.

Next, the operation of the pre-phase converter 9 of the present embodiment 2 will be described.

The dividing ratio selector 30 selects one of the outputs of the pre-delay circuits 14b–14z in response to the output Ds of the dividing ratio decoder 29, and outputs it as the select delay clock signal Cz. Receiving it along with the signal Ca fed from the pre-delay circuit 14a through the delay circuit 31, the pre-delay controller 15 outputs the pre-delay control signals Sa and Sb in response to the phase difference of the two input signals. Since the operation in the case where the dividing ratio selector 30 selects the output Cz0 of the final pre-delay circuit 14z is the same as that of the embodiment 1, description thereof will be omitted here.

When the dividing ratio selector 30 selects the output of an n-th pre-delay circuit 14n other than the final pre-delay circuit 14z, the delay time from the initial pre-delay circuit 14a to n-th pre-delay circuit 14n is aligned to the fundamental clock signal CLK so that the phase of the output of the (n+1)-th pre-delay circuit agrees with that of the initial pre-delay circuit 14a. In the main phase converter 10 also, the output signals from the (n+1)-th and the following main delay circuit sequences 25 have the same phases as those of the first pre-delay clock signal C1 to the n-th pre-delay clock signal Cn.

In this case, since each of the first to n-th pre-delay circuits 25a–25n has the same delay time, the phase shift of the pre-delay clock signals increases with maintaining the order of the pre-delay clock signals.

According to the embodiment 2, the dividing ratio selector 30 controls the effective number of the pre-delay circuits in the pre-delay circuit sequence 14, which are controlled to operate in synchronization with the fundamental clock signal CLK by the pre-delay controller 15. This enables the number of the main delay clock signals Cm per clock period to be varied by only switching the pre-delay clock signal output from the dividing ratio selector 30. In addition, since the successive pre-delay clock signals keep the same intervals, and the number of the main delay clock signals during each of the same intervals is identical, the output order of the main delay clock signals Cm can be maintained. As a result, 64 or 128 gray level images can be formed besides 256 gray level images, which allows this system to be applied to a wide range of gray scale image generators.

EMBODIMENT 3

FIGS. 9A and 9B are block diagrams showing a configuration of the pre-phase converter 9 of an embodiment 3 in accordance with the present invention. In FIG. 9A, the reference numeral 32 designates a delay amount decoder for decoding delay setting data Dst which is set in the pulse-width control IC. The output Sd of the delay amount decoder 32 is input to the entire pre-delay circuits 14a–14z. FIG. 9B is a block diagram showing a configuration of each of the pre-delay circuits 14a–14z. In FIG. 9B, reference numerals 17's each designate a buffer, and 34 designates a unit delay time selector 34 for selecting one of the outputs of the buffers 17 in response to the selection signal Sd fed from the delay amount decoder 32. Since the remaining configuration is the same as that of the embodiment 1, description thereof is omitted here by designating like portions by the same reference numerals.

Next, the operation of the pre-phase converter 9 of the present embodiment 3 will be described.

The unit delay time selector 34 in each pre-delay circuits 14a–14z selects one of the buffers 17 in response to the output Sd of the delay amount decoder 32. Receiving the fundamental clock signal CLK from the buffer 16 in this state, the pre-delay circuits 14a–14z sequentially output the pre-delay clock signals C1–C32 from the selected buffers 17.

For example, selecting the initial buffer 17 by the unit delay time selector 34 in each pre-delay circuits 14a–14z enables the same operation as that of the embodiment 1 by applying the same fundamental clock signal CLK. Selecting the m-th buffer 17 other than the initial one by the unit delay time selector 34 increases the delay of the fundamental clock signal CLK through the respective pre-delay circuits 14a–14z by a factor of m, where m is a natural number greater than one, thereby increasing the total delay amount of the pre-delay circuit sequence 14 by a factor of m. This means that when a clock signal with a period of m times that of the embodiment 1 is input, the phase differences between the pre-delay clock signals are increased by a factor of m.

In this case, since the pre-delay circuits 14a–14z each have the same delay time, the relationships between the pre-delay clock signals can be maintained.

Thus, the present embodiment 3 comprises the pre-delay circuits 14a–14z each including the buffers 17 formed in the CMOS process, and the unit delay time selector 34 for selecting one of the buffers 17. This enables the fundamental clock signal CLK with a longer period to be handled appropriately with maintaining the relationships between the phase converted clock signals. As a result, it can implement 256 gray levels in an image generator having a wide range from a low to high rate.

EMBODIMENT 4

Figure 10:
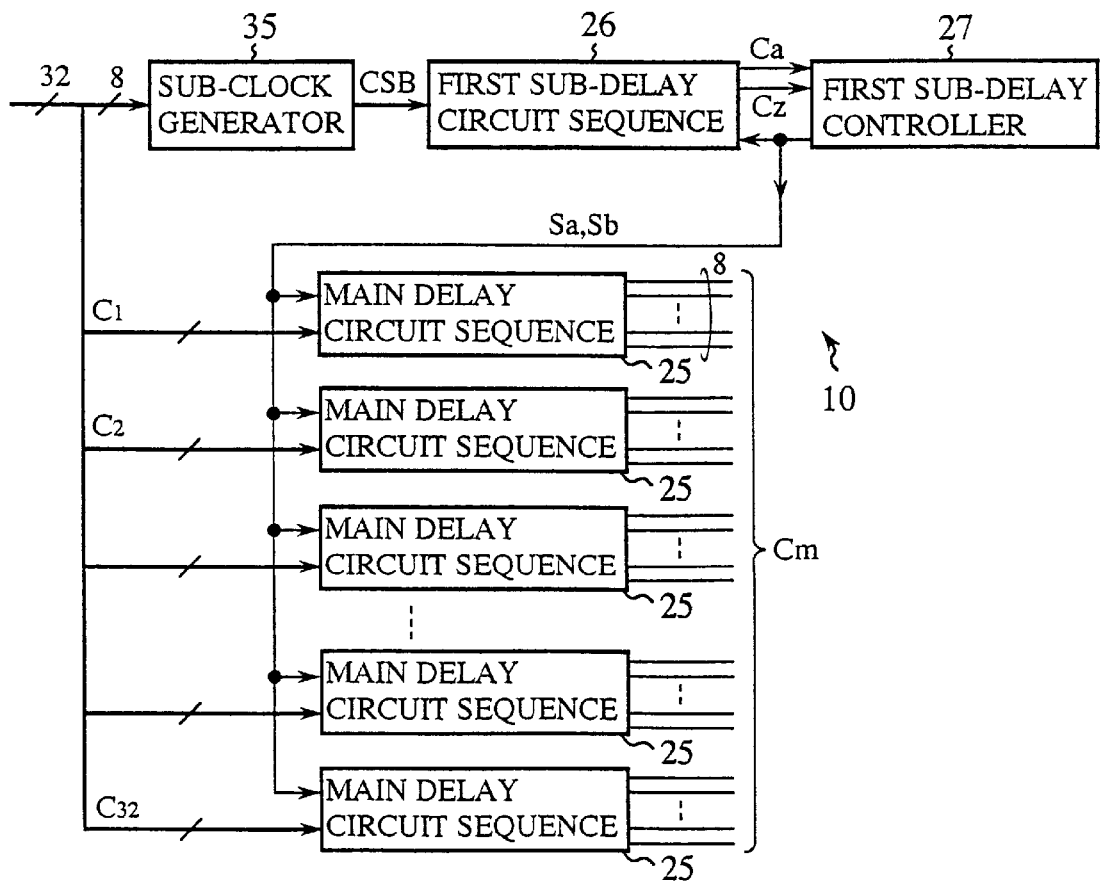
FIG. 10 is a block diagram showing a configuration of the main phase converter 10 of an embodiment 4 of the pulse-width modulation signal generator in accordance with the present invention.

FIG. 10 is a block diagram showing the main phase converter 10 of an embodiment 4 in accordance with the present invention. In FIG. 10, the reference numeral 35 designates a sub-clock generator for supplying the first sub-delay circuit sequence 26 with the sub-clock signal CSB in place of the sub-clock buffer 28 as shown in FIG. 6. Since the remaining configuration is the same as that of the embodiment 1, description thereof is omitted here by designating the corresponding portions by the same reference numerals.

FIG. 11 is a circuit diagram showing a configuration of the sub-clock generator 35 in detail. In FIG. 11, the reference numerals 35a–35h each designate an NAND gate for carrying out logical NAND operation between two of the eight pre-delay clock signals C1, C3, C5, C7, C9, C11, C13 and C15; and 35i designates a sub-clock selector for selecting one of the outputs of the eight NAND gates 35a–35h. The reference numeral 35j designates a 3-bit counter for counting the rising edges of the selector output Sout; 35k designates a D flip-flop for inverting its output every time the selector output Sout is applied as its trigger signal; and 35l designates a ⅓ frequency divider for dividing the output frequency of the D flip-flop 35k by three.

Next, the operation of the main phase converter 10 will be described.

FIG. 12 is a table showing the relationships between the output of the 3-bit counter 35j and the selection operation of the sub-clock selector 35i. In FIG. 12, a set of S2, S1 and S0 designates a 3-bit output of the 3-bit counter 35j; and Sout designates the output of the sub-clock selector 35i, which is selected in response to the output of the counter 35j. Thus, the selector 35i outputs the signal Sout in the order as shown in FIG. 12 every time the counter 35j counts up the rising edge of the selector output Sout.

Figure 13:
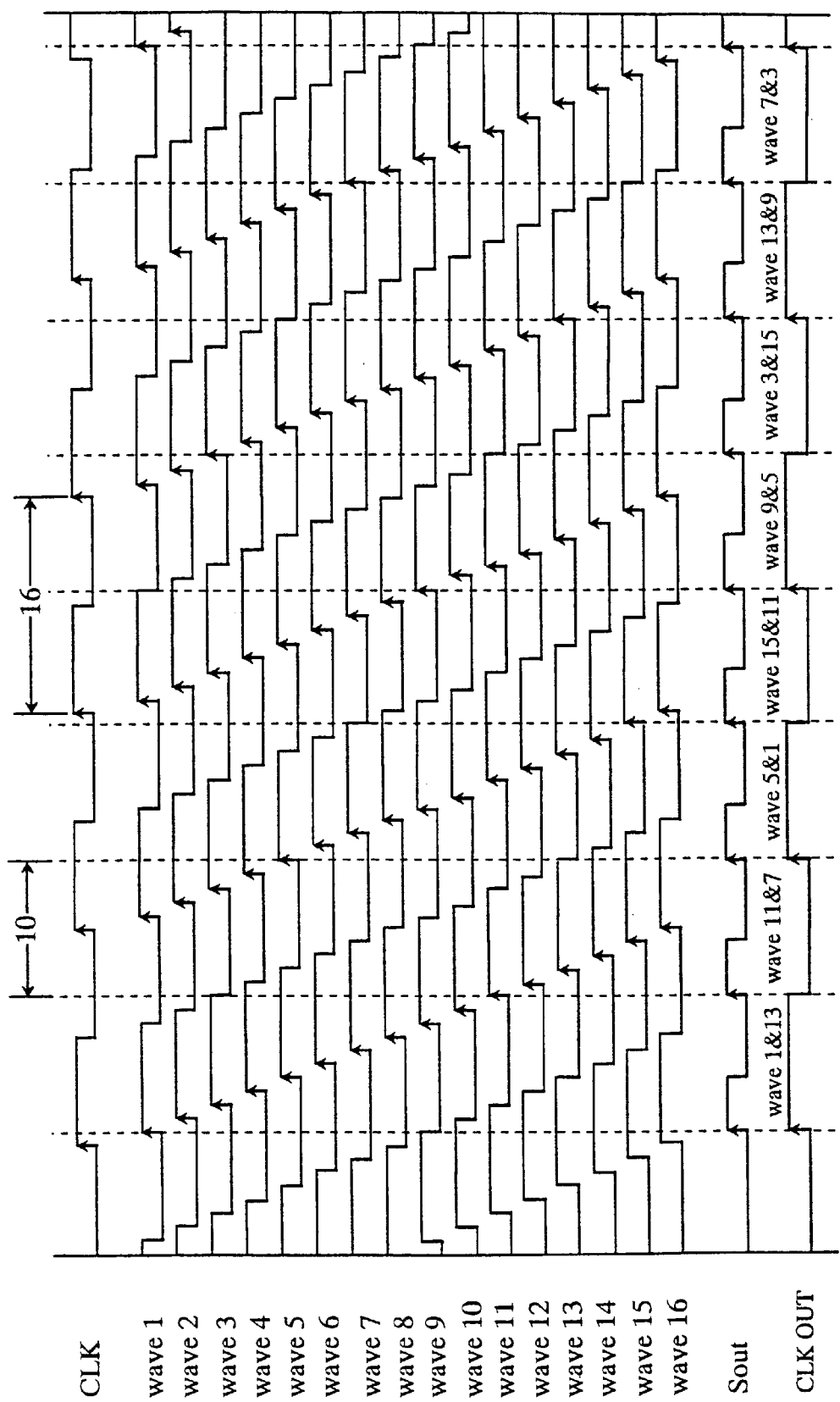
FIG. 13 is a timing chart showing the operation of a sub-clock generator 35 in the embodiment 4.
Figure 16:
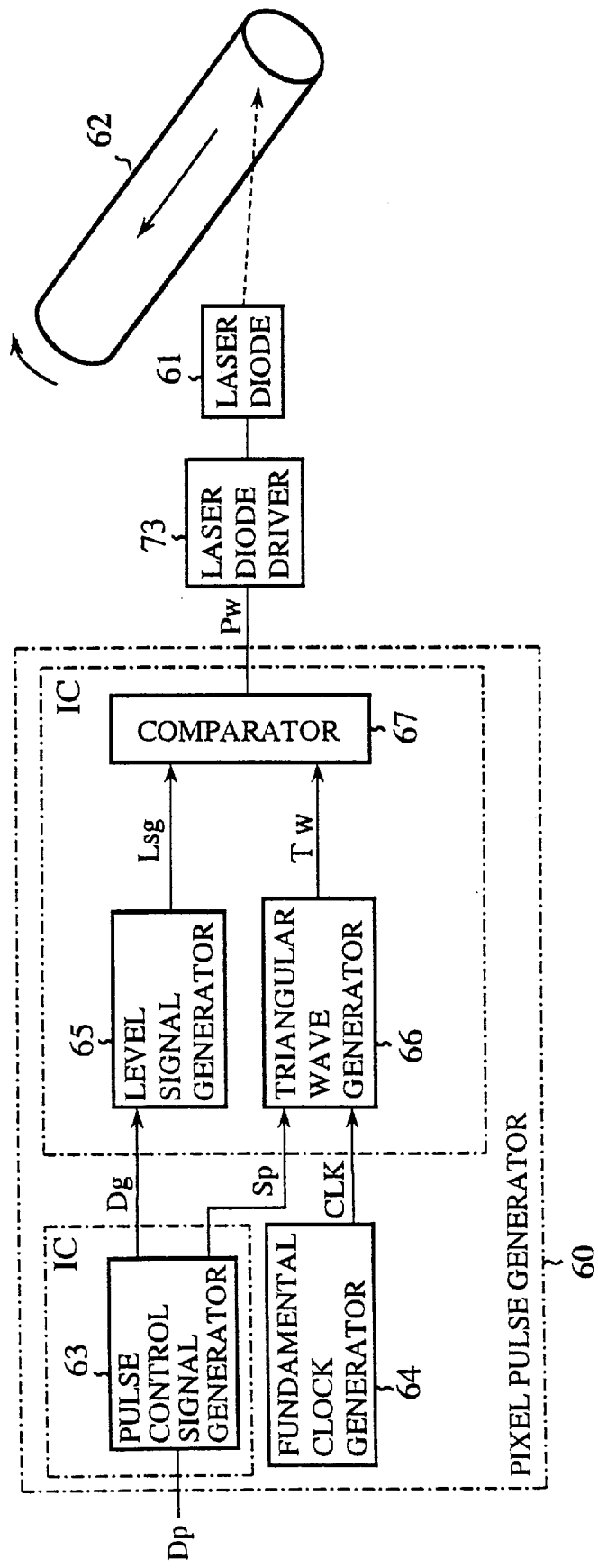
FIG. 16 is a block diagram showing a configuration of an image output portion of a conventional laser beam printer.
Figure 17:
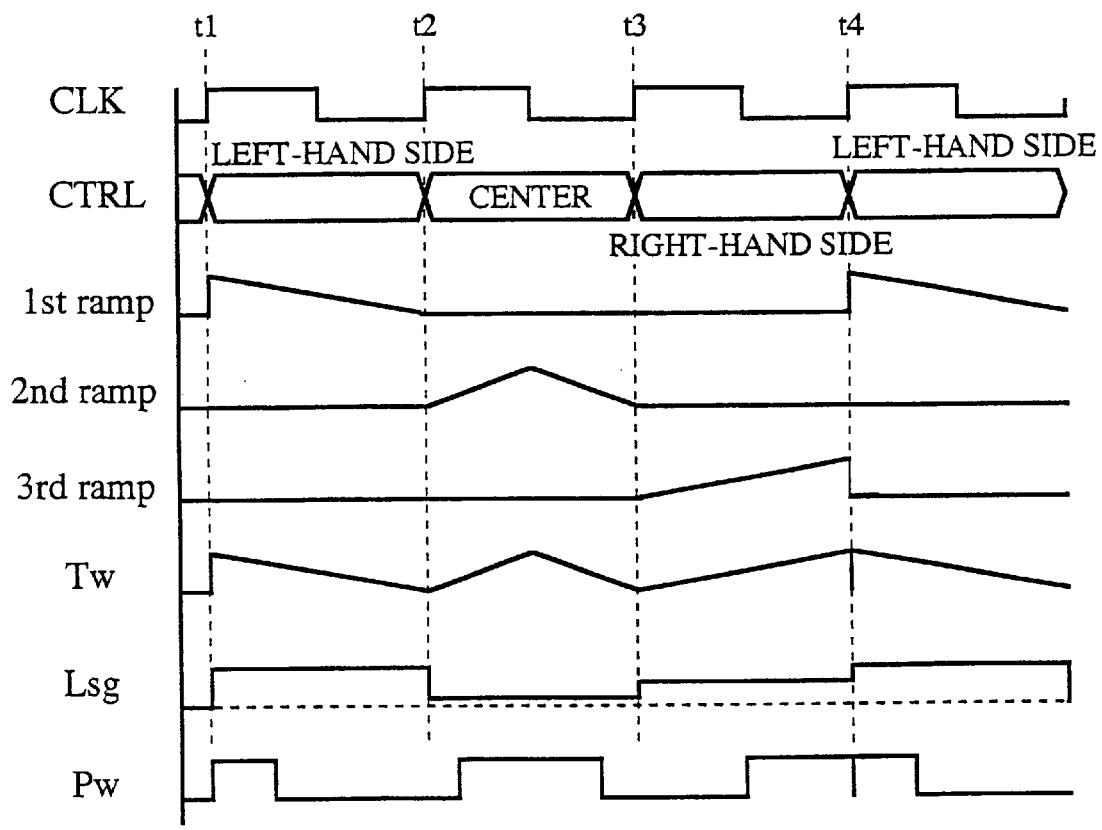
FIG. 17 is a timing chart showing relationships between various signals in a conventional pixel pulse generator.
Figure 18:
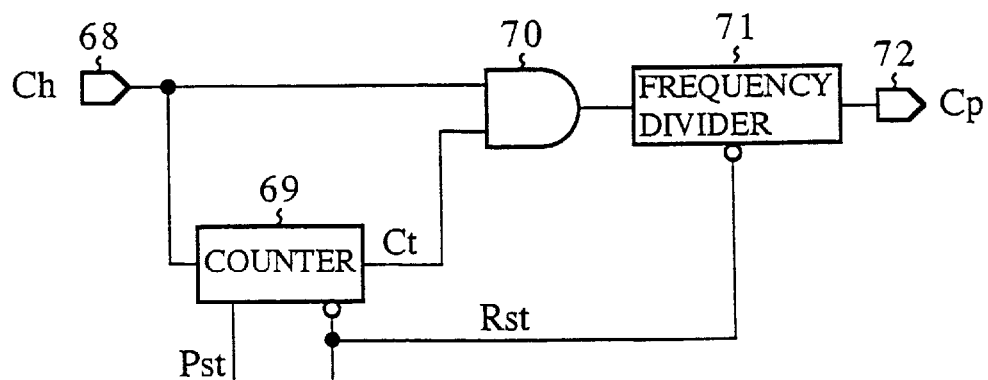
FIG. 18 is a block diagram showing a phase conversion circuit arranged using only digital circuits.

FIG. 13 is a timing chart illustrating the operation of the counter 35j. In FIG. 13, the symbol CLK designates the fundamental clock signal CLK input to the pre-delay circuit sequence 14, wave1–wave16 each designate one of the 16 pre-delay clock signals output from the pre-delay circuits in the pre-delay circuit sequence 14, Sout designates the selector output, and CLKOUT designates the output of the D flip-flop 35k.

As illustrated in FIG. 13, when the selector 35i sequentially selects one of the inputs in response to the counter output S0–S2, the ratio of the period of the signal Sout to that of the fundamental clock signal CLK becomes 10/16. Hence, if the period of the fundamental clock signal CLK is 20 ns (50 MHz), that of the signal Sout becomes 12.5 ns (80 MHz), and the D flip-flop 35k outputs a clock signal with a period of 25 ns (40 MHz) and the ⅓ frequency divider 35l outputs a clock signal with a period of 75 ns (13.3 MHz).

According to the present embodiment 4, the sub-clock generator 35 generates in response to the pre-delay clock signals the sub-clock signal CSB with a period of 75 ns when the fundamental clock signal CLK has a period of 20 ns (50 MHz). This makes it possible to remove from the pulse-width control IC the external input terminal for inputting the sub-clock signal CSB with maintaining the same operation as that of the embodiment 1.

EMBODIMENT 5

FIG. 14 is a block diagram showing a configuration of the main phase converter 10 of an embodiment 5 in accordance with the present invention. In this figure, the reference numerals 36's each designate a middle delay circuit to which one of the 32 pre-delay clock signals C1–C32 output from the pre-delay circuits 14a–14z is supplied. The reference numeral 38 designates a second sub-delay circuit which consists of a plurality of second sub-delay circuits connected in cascade, and to which the sub-clock signal CSB is supplied. The reference numeral 39 designates a second sub-delay controller for controlling the delay time of the second sub-delay circuits in the second sub-delay circuit 38. Configurations of the second sub-delay circuit 38 and second sub-delay controller 39 are analogous to those of the first sub-delay circuit sequence 26 and first sub-delay controller 27, respectively, and the second sub-delay controller 39 outputs sub-delay control signals Sa2 and Sb2 that control the delay amount of the middle delay circuits 36 to become half that of the main delay circuit 25a. A pair of main delay circuit sequences 25, each consisting of four main delay circuits, are provided for each of the pre-delay clock signals C1–C32, and one of them is supplied with the pre-delay clock signal Ci directly and the other of them is supplied with it through the middle delay circuit 36. Since the remaining portion is the same as that of the embodiment 1, description thereof is omitted here by designating corresponding portions by the same reference numerals.

FIGS. 15A and 15B are circuit diagrams showing a configuration of the middle delay circuit 36. In FIG. 15A, the reference numeral 36a designates a middle buffer for providing the pre-clock signal Ci with a delay half the delay amount of the main delay circuit 25*a*. In FIG. 15B, the reference numerals 37*a* and 37*b* each designate a CMOS buffer consisting of a pMOS transistor and an nMOS transistor; 37*c* and 37*d* each designate a high potential side current control transistor consisting of a pMOS transistor connected between a high potential power supply and the CMOS buffer 37*a* or 37*b*; and 37*e* and 37*f* each designate a low potential side current control transistor consisting of an nMOS transistor connected between the CMOS buffer 37*a* or 37*b* and a low potential power supply. The two CMOS buffers 37*a* and 37*b* are connected in cascade.

Thus, the present embodiment 5 comprises, for each pre-delay clock signal Ci, a pair of the main delay circuit sequences 25, one of which receives the pre-delay clock signal Ci directly and the other of which receives it through the middle delay circuit 36. This makes it possible to halve the number of main delay circuits required for each main delay circuit sequence 25 while maintaining the 256 gray levels, thereby further reducing timing errors due to variations in the main delay circuits. As a result, it becomes easier for the main delay circuits to establish accurate intervals between 256 phase converted clock signals generated for forming 256 gray level images.

What is claimed is:

1. A pulse-width modulation signal generator including a clock signal generator receiving a clock signal and generating a plurality of main delay clock signals, each main delay clock signal having a period identical to a period of the clock signal and differing in phase from each other, said pulse-width modulation signal generator generating a pulse-width modulation signal using the plurality of main delay clock signals, said clock signal generator comprising:

a pre-delay circuit sequence including a plurality of cascaded pre-delay circuits, receiving a clock signal and outputting pre-delay clock signals;

a pre-delay controller for comparing two of the pre-delay clock signals output from said plurality of pre-delay circuits, and for controlling said pre-delay circuits to maintain a fixed phase difference between the two pre-delay clock signals; and a plurality of main delay circuit sequences, each of said main delay circuit sequences including a plurality of cascaded main delay circuits, and receiving one of the pre-delay clock signals, wherein said cascaded pre-delay circuits in said pre-delay circuit sequence are larger in number than said cascaded main delay circuits in each of said plurality of main delay circuit sequences.

2. The pulse-width modulation signal generator as claimed in claim 1, wherein said pre-delay circuit sequence comprises (N+1) pre-delay circuits, with N the pre-delay clock signals, and wherein said pre-delay controller comprises:

a phase comparator for comparing an output of an initial pre-delay circuit with an output of a final pre-delay circuit of said cascaded pre-delay circuits, and outputting a phase comparison signal corresponding to a phase difference between the outputs of the initial and final pre-delay circuits;

a charge pump for storing a charge current in response to the phase comparison signal; and a control circuit for controlling a delay of said pre-delay circuits in response to an integral of the charge current.

3. The pulse-width modulation signal generator as claimed in claim 1, comprising a dividing ratio selector receiving at least two successive pre-delay clock signals output from a second to a final pre-delay circuit in said pre-delay circuit sequence, and selecting one of the pre-delay clock signals as a selected delay clock signal, and wherein said pre-delay controller receives the selected delay clock signal instead of an output of the final pre-delay circuit.

4. The pulse-width modulation signal generator as claimed in claim 1, wherein each of said plurality of pre-delay circuits comprises:

a plurality of cascaded CMOS delay elements producing a plurality of outputs, and a delay time selector for selecting one of the outputs of said plurality of delay elements.

5. The pulse-width modulation signal generator as claimed in claim 1, comprising:

a sub-delay circuit sequence including a plurality of cascaded sub-delay circuits, and receiving a sub-clock signal; and a sub-delay controller comparing two sub-delay clock signals output from said plurality of sub-delay circuits, and outputting a delay control signal to maintain a fixed phase difference between the two sub-delay clock signals, wherein said sub-delay controller supplies the delay control signal to said plurality of main delay circuits.

6. The pulse-width modulation signal generator as claimed in claim 5, comprising an external terminal for receiving the sub-clock signal from an external device.

7. The pulse-width modulation signal generator as claimed in claim 5, comprising a sub-clock generator receiving at least one of the clock signal and the pre-delay clock signals, and generating the sub-clock signal having a period longer than the clock signal.

8. A pulse-width modulation signal generator including a clock signal generator receiving a clock signal and generating a plurality of main delay clock signals having a period identical to a period of the clock signal and differing in phase from each other, said pulse-width modulation signal generator generating a pulse-width modulation signal using the plurality of main delay clock signals, said clock signal generator comprising:

a pre-delay circuit sequence including a plurality of cascaded pre-delay circuits, and receiving a clock signal;

a pre-delay controller for comparing two pre-delay clock signals output from said plurality of pre-delay circuits, and for controlling said pre-delay circuits to maintain a fixed phase difference between the two pre-delay clock signals;

a plurality of main delay circuit sequences, each of said main delay circuit sequences including a plurality of cascaded main delay circuits, and receiving one of the pre-delay clock signals;

a plurality of middle delay circuits, each of said middle delay circuits being connected between said pre-delay circuit sequence and one of said plurality of main delay circuit sequences, and delaying one of the pre-delay clock signals to be output, wherein each of the pre-delay clock signals is directly supplied to at least one of said plurality of main delay circuit sequences, and supplied to at least another of said plurality of said main delay circuit sequences through one of said middle delay circuits.

9. The pulse-width modulation signal generator as claimed in claim 8, wherein said pre-delay circuit sequence comprises (N+1) pre-delay circuits, with N pre-delay clock signals, and wherein the pre-delay controller comprises:

a phase comparator for comparing an output of an initial pre-delay circuit with an output of a final pre-delay circuit of said cascaded pre-delay circuits, and outputting a phase comparison signal corresponding to a phase difference between the outputs of said initial and final pre-delay circuits;

a charge pump for storing a charge current in response to the phase comparison signal; and a control circuit for controlling delay of said pre-delay circuits in response to an integral of the charge current.

10. The pulse-width modulation signal generator as claimed in claim 8, comprising a dividing ratio selector receiving at least two successive pre-delay clock signals output from a second to a final pre-delay circuits in said pre-delay circuit sequence, and selecting one of the pre-delay clock signals as a selected delay clock signal, and wherein said pre-delay controller receives said selected delay clock signal instead of an output of said final pre-delay circuit.

11. The pulse-width modulation signal generator as claimed in claim 8, wherein each of said plurality of pre-delay circuits comprises a plurality of cascaded CMOS delay elements producing a plurality of outputs, and a delay time selector for selecting one of the outputs of said plurality of delay elements.

12. The pulse-width modulation signal generator as claimed in claim 8, comprising:

a sub-delay circuit sequence including a plurality of cascaded sub-delay circuits, and receiving a sub-clock signal; and a sub-delay controller comparing two sub-delay clock signals output from said plurality of sub-delay circuits, and outputting a delay control signal to maintain a fixed phase difference between the two sub-delay clock signals, wherein said sub-delay controller supplies the delay control signal to said plurality of main delay circuits.

13. The pulse-width modulation signal generator as claimed in claim 12, comprising an external terminal for receiving the sub-clock signal from an external device.

14. The pulse-width modulation signal generator as claimed in claim 12, comprising a sub-clock generator receiving at least one of the clock signal and pre-delay clock signals, and generating the sub-clock signal having a period longer than the clock signal.

* * * * *